(12) United States Patent
Ku et al.

(10) Patent No.: US 12,431,173 B2
(45) Date of Patent: Sep. 30, 2025

(54) MEMORY PACKAGE PERFORMING TRAINING OPERATION USING ADDRESS-DELAY MAPPING AND MEMORY SYSTEM INCLUDING THE SAME

(71) Applicant: Samsung Electronics Co., Ltd., Suwon-si (KR)

(72) Inventors: Hwanseok Ku, Suwon-si (KR); Youngmin Jo, Suwon-si (KR); Anil Kavala, Suwon-si (KR); Jungjune Park, Suwon-si (KR); Chiweon Yoon, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 166 days.

(21) Appl. No.: 18/494,258

(22) Filed: Oct. 25, 2023

(65) Prior Publication Data
US 2024/0257848 A1    Aug. 1, 2024

(30) Foreign Application Priority Data

Jan. 26, 2023 (KR) .......................... 10-2023-0009871

(51) Int. Cl.
*G11C 7/10* (2006.01)
*G11C 7/22* (2006.01)
*G11C 8/18* (2006.01)

(52) U.S. Cl.
CPC ............ *G11C 7/222* (2013.01); *G11C 7/1057* (2013.01); *G11C 8/18* (2013.01)

(58) Field of Classification Search
CPC ......... G11C 7/222; G11C 7/1057; G11C 8/18; G11C 29/023; G11C 29/028; G11C 29/50012; G11C 2029/0409; G11C 7/225; G11C 7/22; G11C 7/1084; G06F 13/1673; G06F 3/061; G06F 3/0658
USPC ....................................................... 365/233.1
See application file for complete search history.

(56) References Cited

U.S. PATENT DOCUMENTS

| | | | |
|---|---|---|---|
| 6,915,226 B2 | 7/2005 | Liou | |
| 7,679,133 B2 | 3/2010 | Son et al. | |
| 8,553,466 B2 | 10/2013 | Han et al. | |
| 8,559,235 B2 | 10/2013 | Yoon et al. | |

(Continued)

FOREIGN PATENT DOCUMENTS

KR           102365110 B1     2/2022

*Primary Examiner* — Huan Hoang
(74) *Attorney, Agent, or Firm* — Harness, Dickey & Pierce, P.L.C.

(57) ABSTRACT

A memory package includes a data input/output pin, a data strobe pin, a plurality of memory devices, and a buffer device. The data input/output pin receives a data signal. The data strobe pin receives a data strobe signal. The plurality of memory devices operate based on the data signal and the data strobe signal. The buffer device is between the data input/output pin, the data strobe pin and the plurality of memory devices, and performs a training operation based on training data and the data strobe signal in response to the data signal including the training data and the data strobe signal being received. During the training operation, the buffer device sets different delays on a plurality of sub-training data included in the training data, and the sub-training data on which the different delays are set are stored in different memory regions of the plurality of memory devices.

20 Claims, 27 Drawing Sheets

(56) References Cited

U.S. PATENT DOCUMENTS

| | | |
|---|---|---|
| 8,654,587 B2 | 2/2014 | Yoon et al. |
| 10,067,718 B2 | 9/2018 | Covington et al. |
| 10,824,575 B2 | 11/2020 | Lee et al. |
| 11,217,283 B2 | 1/2022 | Lee et al. |
| 11,238,954 B2 | 2/2022 | Kim et al. |
| 11,249,662 B2 | 2/2022 | Kim et al. |
| 2011/0233648 A1 | 9/2011 | Seol et al. |
| 2019/0079699 A1* | 3/2019 | Lee .................. G11C 7/22 |
| 2022/0317933 A1 | 10/2022 | Kim et al. |

* cited by examiner

| DATA | ADDRESS | DELAY |
|---|---|---|
| STD1 | ADDR1 | DLY1 |
| STD2 | ADDR2 | DLY2 |
| ⋮ | ⋮ | ⋮ |
| STDN | ADDRN | DLYN |

FIG. 12

| ADDRESS: | ADDR1 | ADDR2 | ... | ADDRN |
|---|---|---|---|---|
| DELAY: | DLY1 | DLY2 | ... | DLYN |
| TDAT: | STD1 | STD2 | ... | STDN |
| RDAT1: | SRD11 | SRD12 | ... | SRD1N |
| RDAT2: | SRD21 | SRD22 | ... | SRD2N |
| ⋮ | ⋮ | ⋮ | ... | ⋮ |
| RDATM: | SRDM1 | SRDM2 | ... | SRDMN |

MEMORY PACKAGE PERFORMING TRAINING OPERATION USING ADDRESS-DELAY MAPPING AND MEMORY SYSTEM INCLUDING THE SAME

CROSS-REFERENCE TO PRIORITY APPLICATION

This application claims priority under 35 USC § 119 to Korean Patent Application No. 10-2023-0009871, filed Jan. 26, 2023, the contents of which is hereby incorporated herein by reference in its entirety.

BACKGROUND

1. Technical Field

Example embodiments relate to semiconductor integrated circuits, and more particularly, to memory packages performing a training operation using address-delay mapping, and memory systems including the memory packages.

2. Description of the Related Art

Due to the development of memory technology, memory systems for writing and reading a large amount of data have been developed. A plurality of memory devices may be connected to a memory controller included in a memory system to control a memory operation including write operations and read operations. In a structure in which a plurality of memory devices are connected to one memory controller, signals output from the memory controller may not properly reach the plurality of memory devices because the memory controller has high output impedance.

In such memory systems, a buffer device may be connected between the memory controller and the plurality of memory devices, so that the buffer device drives signals received from the memory controller and transfers the driven signals to the memory devices with a sufficient signal strength.

SUMMARY

At least one example embodiment of the present disclosure provides a memory package capable of efficiently performing a training operation using address-delay mapping.

At least one example embodiment of the present disclosure provides a memory system including the memory package.

According to example embodiments, a memory package includes a buffer device; a data input/output pin connected to the buffer device and configured to receive a data signal; a data strobe pin connected to the buffer device and configured to receive a data strobe signal; and a plurality of memory devices connected to the buffer device and configured to operate based on the data signal and the data strobe signal, wherein, in response to receiving the data strobe signal and training data in the data signal, the buffer device is configured to perform a training operation on the plurality of memory devices based on the training data and the data strobe signal, and wherein, during the training operation, the buffer device is configured to set different delays on a plurality of sub-training data included in the training data, and the plurality of sub-training data are stored in different memory regions of the plurality of memory devices.

According to example embodiments, a memory system includes a memory package; and a memory controller configured to control the memory package, wherein the memory package includes a buffer device, a data input/output pin connected to the buffer device and configured to receive a data signal, a data strobe pin connected to the buffer device and configured to receive a data strobe signal, and a plurality of memory devices connected to the buffer device and configured to operate based on the data signal and the data strobe signal, wherein, in response to receiving the data signal and training data in the data signal, the buffer device is configured to perform a training operation on the plurality of memory devices based on the training data and the data strobe signal, and wherein, during the training operation, the buffer device is configured to set different delays on a plurality of sub-training data included in the training data, and the plurality of sub-training are stored in different memory regions of the plurality of memory devices.

According to example embodiments, a memory package includes a buffer device; a data input/output pin connected to the buffer device and configured to receive a data signal; a data strobe pin connected to the buffer device and configured to receive a data strobe signal; and a plurality of memory devices connected to the buffer device and configured to operate based on the data signal and the data strobe signal, wherein, in response to receiving the data strobe signal and training data in the data signal, the buffer device is configured to perform a training operation on the plurality of memory devices based on the training data and the data strobe signal, wherein, during the training operation, the buffer device is configured to set different delays on a plurality of sub-training data included in the training data, and the plurality of sub-training data are stored in different memory regions of the plurality of memory devices, wherein the plurality of sub-training data include first to Nth sub-training data, wherein, during the training operation, the buffer device is configured to set a first address, of a plurality of addresses, and a first delay, of a plurality of delays, on the first sub-training data, and the first sub-training data on which the first delay is set is stored in first memory regions included in the plurality of memory devices corresponding to the first address simultaneously or sequentially, and to receive a plurality of read training data included in the training data from the plurality of memory devices and output the plurality of read training data, and wherein, during the training operation, a plurality of pass/fail maps, associated with the plurality of memory devices, are obtained based on the training data and the plurality of read training data, and training values associated with the plurality of memory devices are obtained based on the plurality of pass/fail maps.

In the memory system and the memory package according to example embodiments, an address-delay mapping method may be adopted in a write training operation. For example, when the training data is received, the buffer device may set delays and addresses that are different from each other on the plurality of sub-training data included in the training data, and the plurality of sub-training data on which the different delays are set are stored in different memory regions of the plurality of memory devices corresponding to the different addresses. A pass/fail map for each delay may be obtained with respect to each memory device, and pass/fail maps, valid windows, and optimal phase differences between the data signal and the data strobe signal may be obtained for all memory devices. The training operation may be performed on the plurality of memory devices at once (e.g., in a one-shot training method). Therefore, the training operation may be efficiently performed, the number of times of the training operations may be reduced, and performance may be improved or enhanced.

BRIEF DESCRIPTION OF THE DRAWINGS

Illustrative, non-limiting example embodiments will be more clearly understood from the following detailed description taken in conjunction with the accompanying drawings.

FIGS. 12, 13A and 13B are diagrams describing an operation of a memory system including the buffer device in FIG. 4.

DETAILED DESCRIPTION

Figure 1:
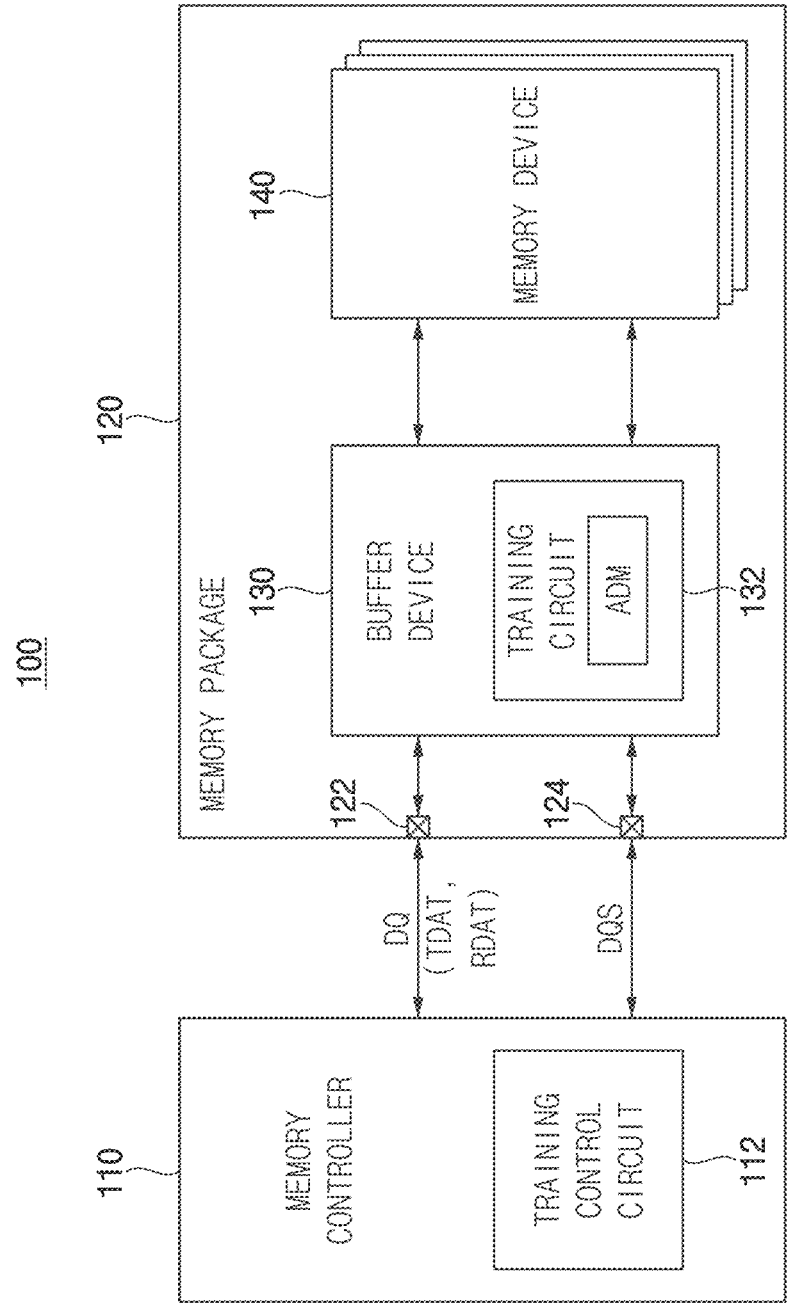
FIG. 1 is a block diagram illustrating a memory package and a memory system including a memory package according to some example embodiments.

Various example embodiments will be described more fully with reference to the accompanying drawings, in which embodiments are shown. The present disclosure may however, be embodied in many different forms and should not be construed as limited to the embodiments set forth herein. Like reference numerals refer to like elements throughout this application.

The elements and/or functional blocks disclosed below may include or be implemented in processing circuitry such as hardware including logic circuits; a hardware/software combination such as a processor executing software; or a combination thereof, unless expressly indicated otherwise. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.; and/or the processing circuitry may include electrical components such as at least one of transistors, resistors, capacitors, etc. and/or electronic circuits including said components. For example, the processing circuitry may include electrical components such as logic gates including at least one of AND gates, OR gates, NAND gates, NOT gates, etc., and/or electronic circuits including said components.

FIG. 1 is a block diagram illustrating a memory package and a memory system including the memory package according to some example embodiments.

Referring to FIG. 1, a memory system 100 includes a memory controller 110 and a memory package 120.

The memory controller 110 controls an overall operation of memory system 100, and controls an operation of the memory package 120.

For example, the memory controller 110 may be configured to control operations (e.g., write/read operations) of the memory system 100 and may control exchange of data (e.g., reception/storage of write data and transmission of read data) between the host device and the memory system 100 based on the requests (e.g., write/read requests) received from an external host device. For example, the memory controller 110 may generate commands (e.g., write/read commands) for controlling operations (e.g., write/read operations) of the memory package 120, may transmit the commands to the memory package 120, and may control exchange of data (e.g., transmission/storage of write data and reception of read data) with the memory package 120. An example of the memory controller 110 will be described with reference to FIG. 3.

The memory package 120 is controlled by the memory controller 110, and stores a plurality of data. The memory package 120 may also be referred to as a memory module or the like.

The memory package 120 includes a data input/output pin 122, a data strobe pin 124, a buffer device 130, and a plurality of memory devices 140. The buffer device 130 and the memory devices 140 may be referred to as a buffer chip and memory chips, respectively.

The memory package 120 is connected to the memory controller 110 through the data input/output pin 122 and the data strobe pin 124. The data input/output pin 122 is configured to receive a data signal DQ from the memory controller 110, and the data strobe pin 124 is configured to receive a data strobe signal DQS from the memory controller 110. The data input/output pin 122 is configured to output the data signal DQ to the memory controller 110. For example, "pin" may be a contact pad and/or a contact pin, but the example embodiments are not limited thereto.

The plurality of memory devices 140 operate based on the data signal DQ and data strobe signal DQS and store a plurality of data. For example, the plurality of memory devices 140 may receive or output the data signal DQ in synchronization with the data strobe signal DQS.

In some example embodiments, the plurality of memory devices 140 may be (and/or may include) a volatile memory, such as dynamic random access memory (DRAM). In some example embodiments, the plurality of memory devices 140 may be (and/or may include) a non-volatile memory, such as flash memory. An example of the plurality of memory devices 140 will be described with reference to FIGS. 2A and 2B.

The buffer device 130 is between plurality of memory devices and the data input/output pin 122 and the data strobe pin 124. In other words, the buffer device 130 may be further considered to be between the memory controller 110 and the plurality of memory devices 140.

In a structure in which the plurality of memory devices 140 are connected to the single memory controller 110, signals output from the memory controller 110 may not properly or adequately be transmitted to the plurality of memory devices 140 because of a high output impedance of the memory controller 110. To solve such problem, a structure in which the buffer device 130 is connected between the memory controller 110 and the plurality of memory devices 140 may be adopted, so that the buffer device 130 may drive signals received from the memory controller 110, and may properly transfer the driven signals to the plurality of memory devices 140.

Under the control of the memory controller 110, the buffer device 130 performs a memory training operation on the plurality of memory devices 140. The memory training operation may also be referred, herein, as a training operation. The training operation may be a timing compensation operation and/or an operation of determining a degree of timing compensation for a signal exchanged between the buffer device 130 and the plurality of memory devices 140. For example, the timing compensation operation may be an operation of delaying a signal using a delay logic, and the degree of timing compensation may indicate the degree of delay. For example, the training operation may be a write training operation for a write operation in which data is transmitted from the buffer device 130 to the plurality of memory devices 140 and written into the plurality of memory devices 140. However, the example embodiments are not limited thereto, and the training operation may be a training operation for various other operations.

In some example embodiments, the memory controller 110 may include a training control circuit 112 that controls the training operation, and the buffer device 130 may include a training circuit 132 that performs the training operation.

When the training operation is to be performed, the memory controller 110 (e.g., the training control circuit 112) may provide the data signal DQ including training data TDAT and the data strobe signal DQS to the memory package 120 (e.g., the buffer device 130) according to a training execution request. When the data signal DQ including the training data TDAT and the data strobe signal DQS are received, the buffer device 130 may perform the training operation on the plurality of memory devices 140 based on the training data TDAT and the data strobe signal DQS.

For example, in at least some embodiments, during the training operation, the buffer device 130 (e.g., the training circuit 132) may set different delays on a plurality of sub-training data included in the training data TDAT, and the plurality of sub-training data on which the different delays are set may be stored in different memory regions of the plurality of memory devices 140. The different memory regions may have different addresses, and therefore, the training operation may be performed based on an address-delay mapping method in which the training data TDAT is stored by matching different addresses with different delays. For example, the training circuit 132 may include an address-delay map ADM used to perform the address-delay mapping method. For example, the memory controller 110 (e.g., the training control circuit 112) may also include information related to the address-delay map ADM.

During the training operation, after the plurality of sub-training data included in the training data TDAT are stored in the different memory regions of the plurality of memory devices 140, the buffer device 130 (e.g., the training circuit 132) may receive a plurality of read training data RDAT corresponding to the training data TDAT from the plurality of memory devices 140 and may output the data signal DQ including the plurality of read training data RDAT. The memory controller 110 (e.g., the training control circuit 112) may acquire a plurality of pass/fail maps associated with the plurality of memory devices 140 based on the training data TDAT, the plurality of read training data RDAT, and the address-delay map ADM, and may acquire and/or set training values associated with the plurality of memory devices 140 based on the plurality of pass/fail maps.

An example of the buffer device 130 and a detailed training operation using the buffer device 130 will be described with reference to FIGS. 4, 5, 6, 7, 8, 9A, 9B, 9C, 10A, 10B, 10C, 11A, 11B, 11C, 12, 13A and 13B.

In some example embodiments, as will be described with reference to FIGS. 9A, 9B and 9C, the training operation (e.g., an operation of storing the plurality of sub-training data on which the different delays are set in the plurality of memory devices 140) may be performed substantially simultaneously on all the plurality of memory devices 140. For example, the training operation may be performed using a one-shot training method.

In some example embodiments, as will be described with reference to FIGS. 10A, 10B and 10C, the training operation (e.g., an operation of storing the plurality of sub-training data on which the different delays are set in the plurality of memory devices 140) may be performed sequentially on the plurality of memory devices 140. For example, the training operation may be performed using a sequential training method.

According to some example embodiments, the training operation may be performed when the memory controller 110 and the memory package 120 are connected at an initial operation time, may be periodically performed while the memory system 100 is operating, or may be performed when a change in an operating environment of the memory system 100 is detected. The above-described operations may be triggered by the memory controller 110.

As described above, the buffer device 130 may be placed between the memory controller 110 and the plurality of memory devices 140 to improve signal integrity and reduce training time. However, as the operation speed increases, not only the training operation between the memory controller 110 and the buffer device 130 but also the training operation between the buffer device 130 and the plurality of memory devices 140 is required to ensure reliability. For example, the write training operation between the memory controller 110 and the buffer device 130 may be performed, and then the write training operation between the buffer device 130 and the plurality of memory devices 140 may be performed.

In the memory package 120 according to some example embodiments, during the training operation on channels between the buffer device 130 and the plurality of memory devices 140, the address-delay mapping method may be applied. For example, when the training data TDAT is received from the memory controller 110, the buffer device 130 may set delays and addresses that are different from each other on the plurality of sub-training data included in the training data TDAT, and the plurality of sub-training data on which the different delays are set may be stored in different memory regions of the plurality of memory devices 140 corresponding to different addresses. A pass/fail map for each delay may be obtained with respect to each memory device 140, and pass/fail maps, valid windows, and optimal phase differences between the data signal DQ and the data strobe signal DQS may be obtained for all memory devices 140. For example, the above-described training operation may be performed on the plurality of memory devices 140 at once (e.g., in the one-shot training method). Therefore, the training operation may be efficiently performed, the number of times of the training operations may be reduced, and performance may be improved or enhanced.

Figure 2A:
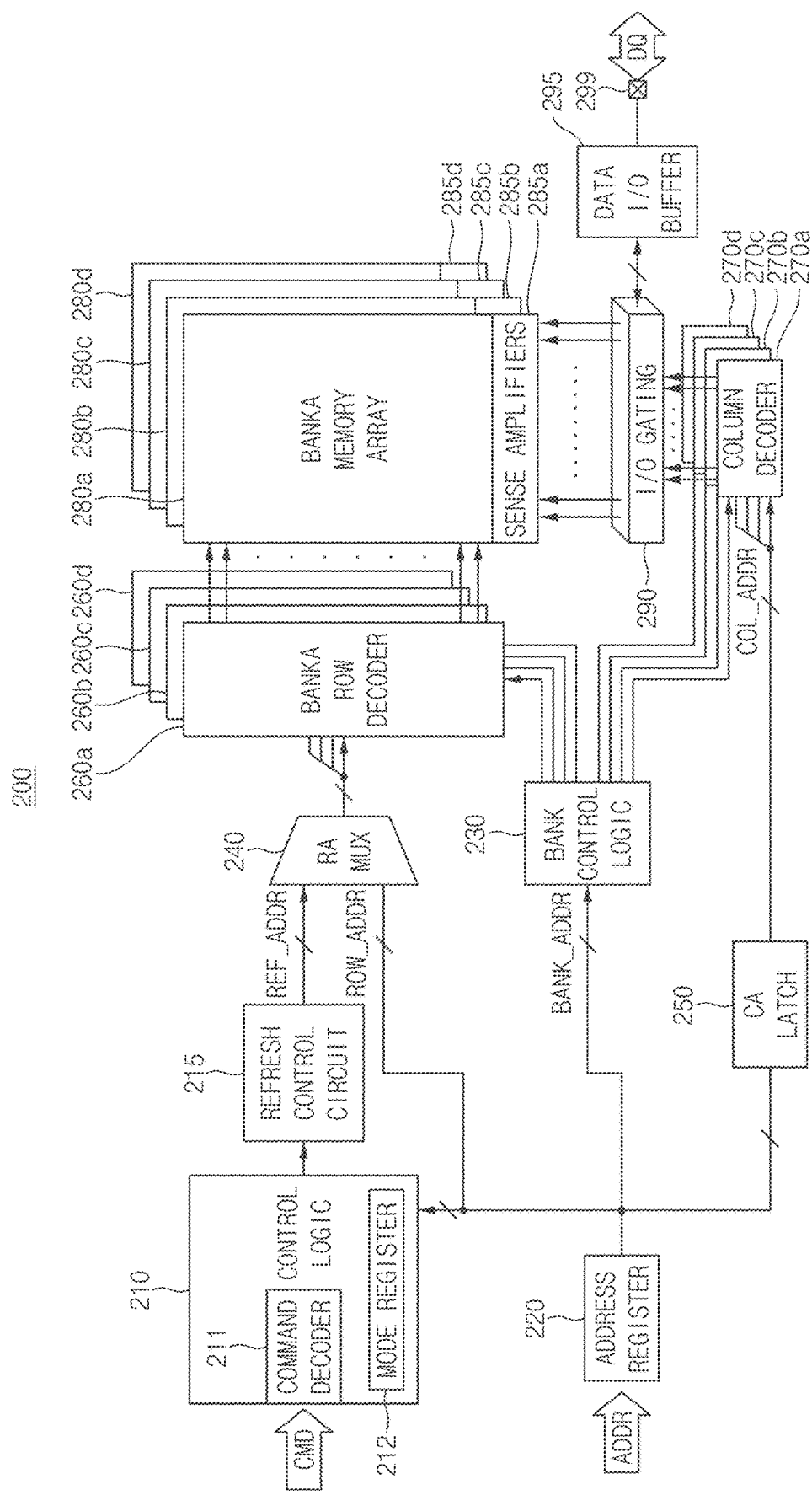
FIGS. 2A and 2B are block diagrams illustrating examples of memory devices included in a memory package according to some example embodiments.
Figure 2B:
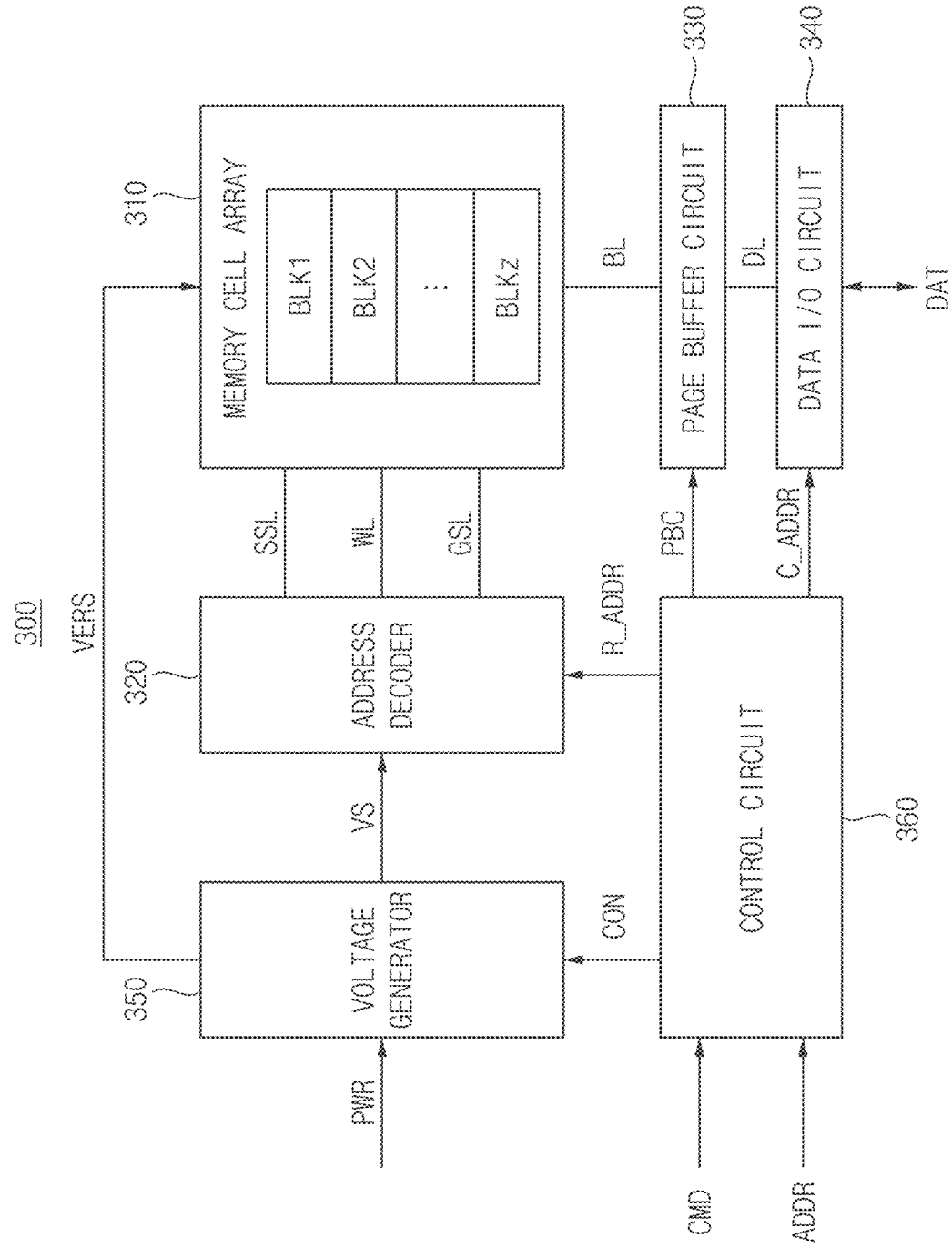

FIGS. 2A and 2B are block diagrams illustrating examples of memory devices included in memory packages according to some example embodiments.

Referring to FIG. 2A, a memory device 200 may include a control logic 210, a refresh control circuit 215, an address register 220, a bank control logic 230, a row address multiplexer 240, a column address latch 250, a row decoder 260a through 260d, a column decoder 270a through 270d, a memory cell array 280a through 280d, a sense amplifier unit 285a through 285d, an input/output (I/O) gating circuit 290, a data I/O buffer 295, and a data I/O pad 299. For example, the memory device 200 may be a volatile memory device, such as a DRAM.

The memory cell array may include a plurality of memory cells and may include first, second, third, and fourth bank arrays 280a, 280b, 280c, and 280d. The row decoder may include first, second, third, and fourth bank row decoders 260a, 260b, 260c, and 260d respectively connected to the first to fourth bank arrays 280a to 280d; the column decoder may include first, second, third, and fourth bank column decoders 270a, 270b, 270c, and 270d respectively connected to the first to fourth bank arrays 280a to 280d; and/or the sense amplifier unit may include first, second, third, and fourth bank sense amplifiers 285a, 285b, 285c, and 285d respectively connected to the first to fourth bank arrays 280a to 280d.

The address register 220 is configured to receive an address ADDR including a bank address BANK_ADDR, a row address ROW_ADDR, and a column address COL_ADDR from an external memory controller (e.g., the memory controller 110 in FIG. 1).

The bank control logic 230 is configured to generate bank control signals in response to the bank address BANK_ADDR. In response to the bank control signals, one of the bank row decoders 260a to 260d corresponding to the received bank address BANK_ADDR and one of the bank column decoders 270a to 270d corresponding to the received bank address BANK_ADDR corresponding to the bank address BANK_ADDR may be activated.

The refresh control circuit 215 is configured to generate a refresh address REF_ADDR when a refresh command is received and/or when entering a self-refresh mode.

The row address multiplexer 240 is configured to receive the row address ROW_ADDR from the address register 220 and the refresh address REF_ADDR from the refresh control circuit 215, and to selectively output the row address ROW_ADDR and/or the refresh address REF_ADDR.

The activated one of the first to fourth bank row decoders 260a to 260d may decode the row address output from the row address multiplexer 240 and may activate a word line corresponding to the row address.

The column address latch 250 is configured receive the column address COL_ADDR from the address register 220 and to temporarily store the received column address COL_ADDR.

The activated one of the first to fourth bank column decoders 270a to 270d may decode the column address COL_ADDR output from the column address latch 250 and may activate the sense amplifier corresponding to the bank address BANK_ADDR and the column address COL_ADDR through the input/output gating circuit 290.

In at least some embodiments, the input/output gating circuit 290 may include circuits gating input/output data. For example, the input/output gating circuit 290 may include an input data mask logic, read data latches which store data output from the first to fourth bank arrays 280a to 280d, and/or write drivers which writes data into the first to fourth bank arrays 280a to 280d.

Data DQ to be read from one of the first to fourth bank arrays 280a to 280d may be detected by a sense amplifier corresponding to the one bank array and may be stored in the read data latches. The data DQ stored in the read data latches may be provided to the memory controller.

The control logic 210 is configured to control an operation of the memory device 200. For example, the control logic 210 may generate control signals for the memory device 200 to perform a write operation or a read operation based on a command CMD received from the memory controller. The control logic 210 may include a command decoder 211 and a mode register 212.

Referring to FIG. 2B, a memory device 300 may include a memory cell array 310, an address decoder 320, a page buffer circuit 330, a data input/output circuit 340, a voltage generator 350, and a control circuit 360. For example, the memory device 300 may be a non-volatile memory device, such as a NAND flash memory.

The memory cell array 310 is connected to the address decoder 320 through a plurality of string selection lines SSL, a plurality of word lines WL, and a plurality of ground selection lines GSL, and is connected to the page buffer circuit 330 through a plurality of bit lines BL. The memory cell array 310 may include a plurality of memory cells and may be divided into a plurality of memory blocks BLK1, BLK2, . . . , and BLKz.

In some example embodiments, the plurality of memory cells may be arranged in a two-dimensional (2D) array structure or a three-dimensional (3D) vertical array structure. For example, the three-dimensional vertical array structure may include vertical cell strings that are vertically oriented such that at least one memory cell is located over another memory cell. The at least one memory cell may comprise a charge trap layer. The following patent documents, which are hereby incorporated by reference in their entirety, describe examples of suitable configurations for a memory cell array including a three-dimensional vertical array structure, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648. However, the example embodiments are not limited thereto.

The control circuit 360 is configured to receive a command CMD and an address ADDR from an external memory controller (e.g., the memory controller 110 in FIG. 1), and controls erase loops (e.g., each erase loop including an erase operation and an erase verification operation), program loops (e.g., each program loop including a program operation and a program verification operation), and a read operation (e.g., a normal read operation and a data recovery read operation) based on the command CMD and the address ADDR. For example, the control circuit 360 may generate control signals CON and PBC, row address R_ADDR, and column address C_ADDR based on the command CMD and the address ADDR.

The address decoder 320 is connected to the memory cell array 310 through the plurality of string select lines SSL, the plurality of word lines WL, and the plurality of ground select lines GSL. For example, during the erase/program/read operations, the address decoder 320 may determine at least one of the plurality of word lines WL, at least one of the plurality of string select lines SSL, and at least one of the plurality of ground select lines GSL as selected word line, selected string select line, and selected ground select line in response to the row address R_ADDR, respectively.

The voltage generator 350 is configured to generate voltages VS for the operation of the memory device 300 based on a power voltage PWR and the control signals CON. The voltages VS may be applied to the plurality of string selection lines SSL, the plurality of word lines WL, and the plurality of ground selection lines GSL through the address decoder 320. Additionally, the voltage generator 350 is configured to generate an erase voltage VERS required for the erase operation based on the power voltage PWR and the control signals CON.

The page buffer circuit 330 may be connected to the memory cell array 310 through the plurality of bit lines BL. The page buffer circuit 330 may include a plurality of page buffers and may store data DAT to be programmed into the memory cell array 310 or read data DAT retrieved from the memory cell array 310.

The data input/output circuit 340 may be connected to the page buffer circuit 330 through data lines DL. The data input/output circuit 340 may provide the data DAT to the memory cell array 310 through the page buffer circuit 330 or provide the data DAT output from the memory cell array 310 to the outside of the memory device 300.

Although the memory devices included in the memory package according to some example embodiments have been described based on DRAM and NAND flash memory, the memory devices included in the memory package may also include various other volatile and/or non-volatile memory devices, such as static random access memory (SRAM), phase-change random access memory (PRAM), resistive random access memory (RRAM), nano floating gate memory (NFGM), polymer random access memory (PoRAM), magnetic random access memory (MRAM), ferroelectric random access memory (FRAM), and/or the like.

Figure 3:
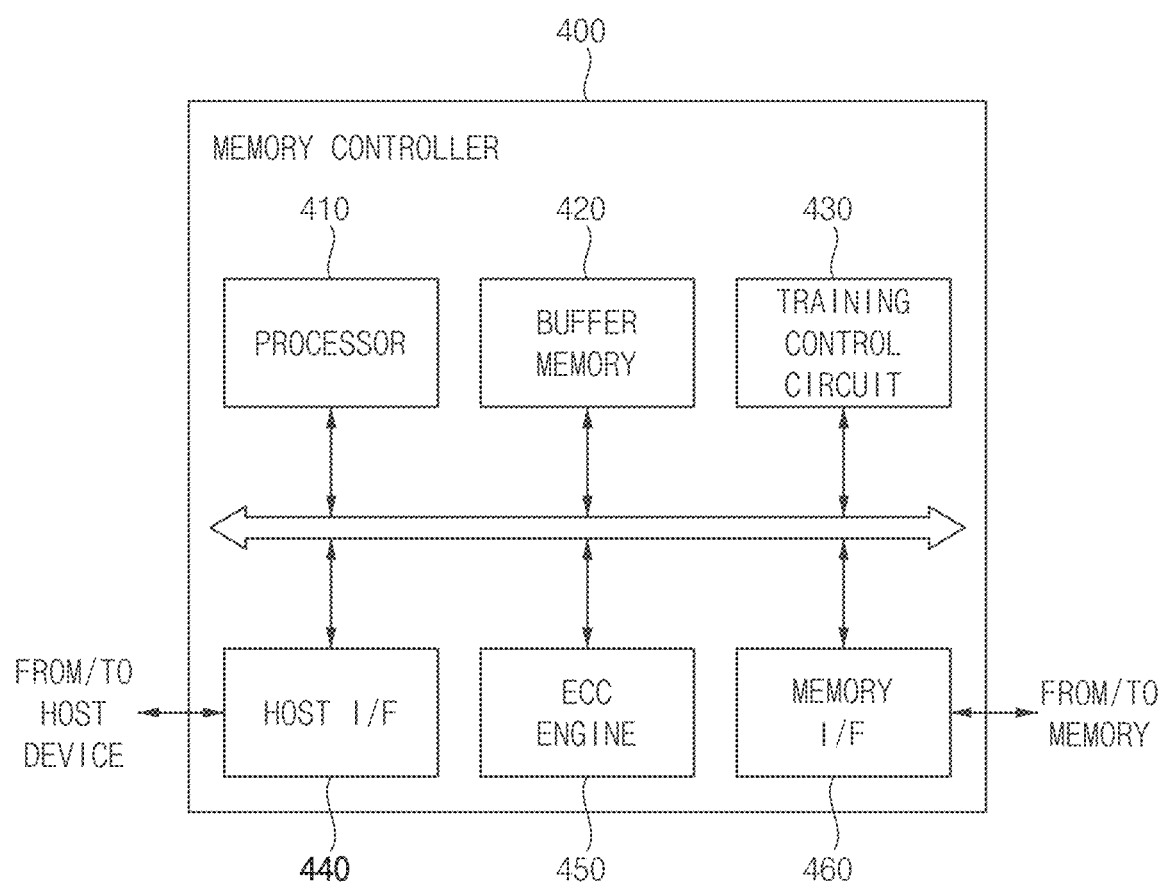
FIG. 3 is a block diagram illustrating an example of a memory controller included in a memory system according to some example embodiments.

FIG. 3 is a block diagram illustrating an example of a memory controller included in a memory system according to some example embodiments.

Referring to FIG. 3, a memory controller 400 may include at least one processor 410, a buffer memory 420, a training control circuit 430, a host interface (I/F) 440, an error correction code (ECC) engine 450, and a memory interface 460.

The processor 410 is configured to control an operation of the memory controller 400 in response to requests received from an external host device through the host interface 440. For example, the processor 410 may control an operation of the memory package 120 and may adopt firmware which drives the memory package 120 to control each of the components.

The buffer memory 420 is configured to store instructions and data executed and processed by the processor 410. For example, the buffer memory 420 may include volatile memory, such as SRAM.

The training control circuit 430 may be substantially the same as the training control circuit 112 in FIG. 1 and is configured to control a training operation according to some example embodiments. For example, the training control circuit 430 may provide the training data TDAT to the memory package 120, may receive the plurality of read training data RDAT from the memory package 120, may obtain a plurality of pass/fail maps on the plurality of memory devices 140, and may obtain and/or set training values on the plurality of memory devices 140 based on the plurality of pass/fail maps.

The error correction code (ECC) engine 450 is configured to correct error, and may perform ECC encoding and ECC decoding using, e.g., Bose-Chaudhuri-Hocquenghem (BCH) code, Low Density Parity Check (LDPC) code, Turbo Code, Reed-Solomon Code, Convolution Code, Recursive Systematic (RSC) Code, Trellis-Coded Modulation (TCM), Block Coded Modulation (BCM) coded modulation, and/or other error correction codes.

The host interface 440 is configured to provide a connection between the memory controller 400 and the host device. For example, the host interface 440 may provide interfacing with the memory controller 400 corresponding to a bus format of the host device. For example, the bus format of the host device may be Advanced Technology Attachment (ATA), Serial ATA (SATA), Parallel ATA (PATA), Small Computer Small Interface (SCSI), Serial Attached SCSI (SAS), Peripheral Component Interconnect express (PCIe), Non-Volatile Memory express (NVMe), Universal Flash Storage (UFS), embedded multi-media card (eMMC), Compute eXpress Link (CXL), and/or the like.

The memory interface 460 is configured to provide a connection between the memory controller 400 and a plurality of memory devices (e.g., the plurality of memory devices 140 in FIG. 1). For example, the memory interface 460 may be implemented to comply with standard protocols such as Toggle, open NAND flash interface (ONFI), and/or the like.

Figure 4:
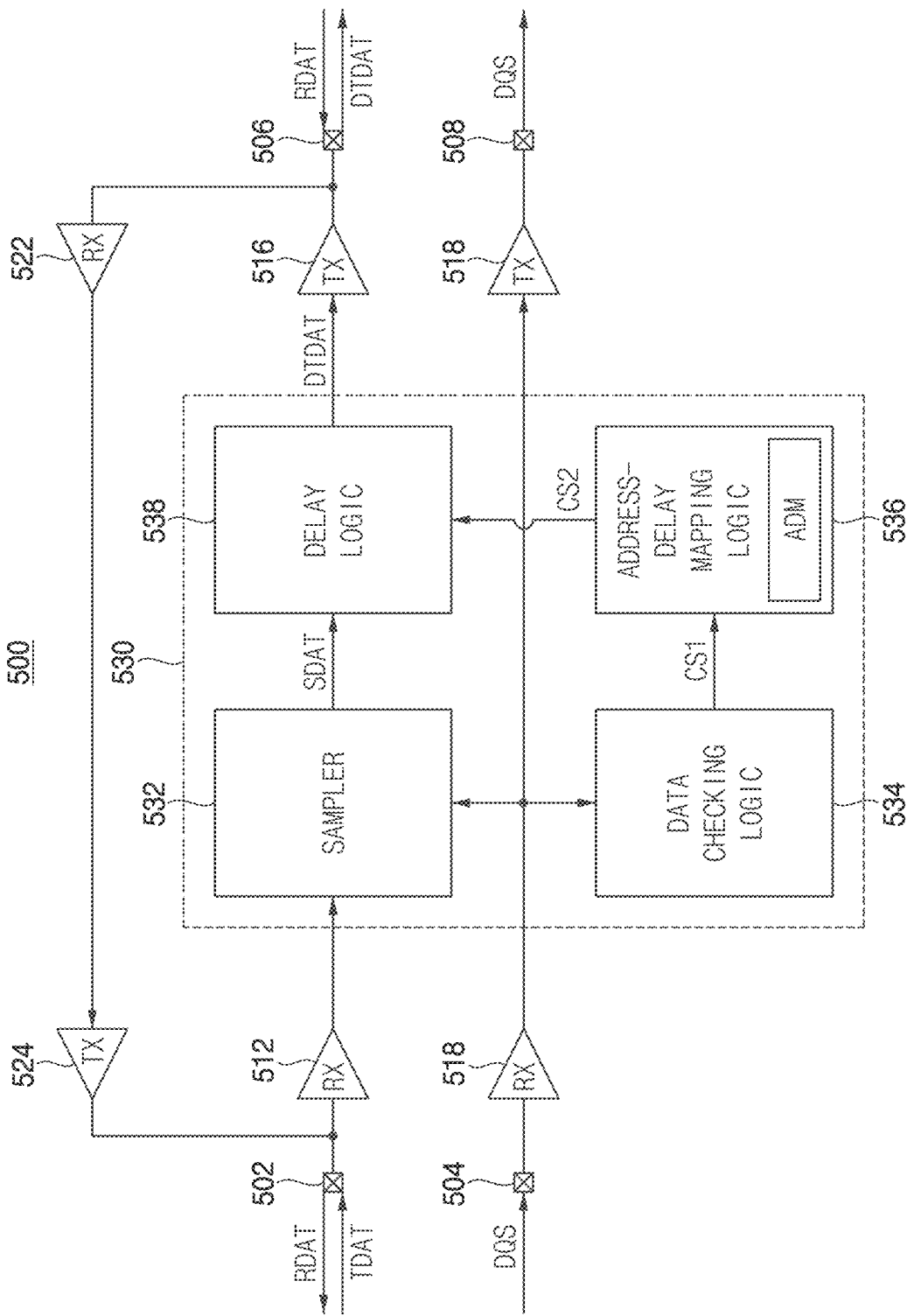
FIG. 4 is a block diagram illustrating an example of a buffer device included in a memory package according to some example embodiments.

FIG. 4 is a block diagram illustrating an example of a buffer device included in a memory package according to some example embodiments.

Referring to FIG. 4, a buffer device 500 may include data input/output pins 502 and 506, data strobe pins 504 and 508, receivers (RX) 512, 514, and 522, transmitters (TX) 516, 518, and 524, and a training circuit 530.

The data input/output pin 502 is connected to the data input/output pin 122 of the memory package 120, and the data strobe pin 504 is connected to the data strobe pin 124 of the memory package 120. The data input/output pin 506 and the data strobe pin 508 is connected to the plurality of memory devices 140.

The receiver 512 is connected to the data input/output pin 502 and is configured to receive the data signal DQ and the training data TDAT included therein from the memory controller 110 through the data input/output pins 122 and 502. For example, the receiver 514 may be connected to the data strobe pin 504 and may receive the data strobe signal DQS from the memory controller 110 through the data strobe pins 124 and 504.

The training circuit 530 may include a sampler 532, a data checking logic 534, an address-delay mapping logic 536, and a delay logic 538.

The sampler 532 is configured to sample the training data TDAT based on the data signal DQ and the data strobe signal DQS, and to output sampled training data SDAT. For example, the training data TDAT may be sampled based on at least one of the rising edge and falling edge of the data strobe signal DQS.

The data checking logic 534 is configured to generate a first control signal CS1 that identifies the plurality of sub-training data included in the training data TDAT based on the data strobe signal DQS. For example, the value of the first control signal CS1 may change depending on whether a time required to receive one sub-training data has elapsed.

Example configurations of the training data TDAT and the plurality of sub-training data will be described with reference to FIG. 5, and an example configuration of the data checking logic 534 will be described with reference to FIG. 6.

The address-delay mapping logic 536 may set a plurality of addresses that are different from each other and a plurality of delays that are different from each other on the plurality of sub-training data based on the first control signal CS1, and may generate a second control signal CS2 including a delay code associated with the plurality of delays. For example, the address-delay mapping logic 536 may include an address-delay map ADM representing the correspondence between the plurality of addresses and the plurality of delays. For example, the i-th address and the i-th delay may be set on the i-th sub-training data, and as i increases, the i-th delay may increase, where i is a natural number. In at least some embodiments, a value of the second control signal CS2 may be changed so that the delay code sequentially increases.

The delay logic 538 is configured to set the plurality of delays on the plurality of sub-training data based on the sampled training data SDAT and the second control signal CS2, and may output delayed training data DTDAT including the plurality of sub-training data on which the plurality of delays are set.

An example configuration of the address-delay map ADM will be described with reference to FIG. 7, and delay setting operations of the address-delay mapping logic 536 and the delay logic 538 will be described with reference to FIG. 8.

The transmitter 516 may be connected to the delay logic 538 and a data input/output pin 506, and is configured to output the plurality of sub-training data on which the plurality of delays are set (e.g., the delayed training data DTDAT) to the plurality of memory devices 140 through the data input/output pin 506. For example, the transmitter 518 may be connected to the receiver 514 and the data strobe pin 508, and may output the data strobe signal DQS to the plurality of memory devices 140 through the data strobe pin 508.

The receiver 522 may be connected to the data input/output pin 506 and is configured to receive the plurality of read training data RDAT from the plurality of memory devices 140 through the data input/output pin 506. The transmitter 524 may be connected to the receiver 522 and the data input/output pin 502, and may output the plurality of read training data RDAT to the memory controller 110 through the data input/output pin 502.

An operation of providing and storing the delayed training data DTDAT to the plurality of memory devices 140 storage will be described with reference to FIGS. 9A, 9B, 9C, 10A, 10B and 10C, and an operation of receiving the plurality of read training data RDAT and providing the plurality of read training data RDAT to the memory controller 110 will be described with reference to FIGS. 11A, 11B and 11C.

As described above, when the training data TDAT is provided to and stored in the plurality of memory devices 140, the delayed training data DTDAT including the plurality of sub-training data on which the plurality of delays are set may be output using the training circuit 530. In contrast, when receiving the plurality of read training data RDAT corresponding to the training data TDAT and providing the plurality of read training data RDAT to the memory controller 110, the plurality of read training data RDAT may be output without passing through the training circuit 530.

Figure 5:
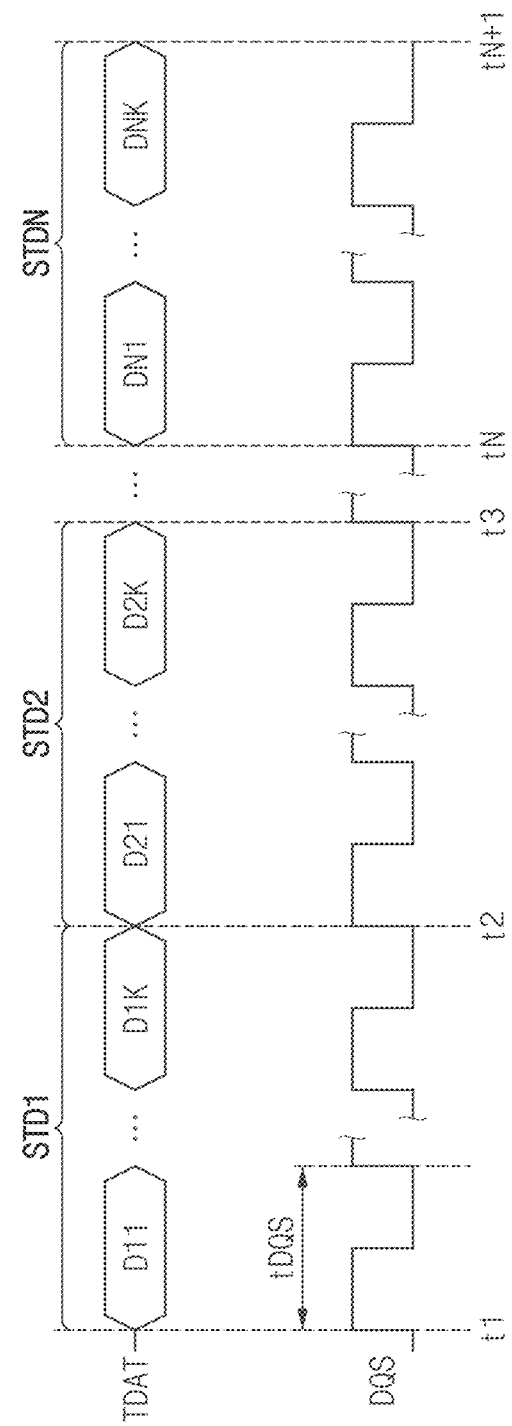
FIG. 5 is a diagram describing an operation of the buffer device in FIG. 4.

FIG. 5 is a diagram describing an operation of the buffer device in FIG. 4.

Referring to FIG. 5, the data strobe signal DQS received from the memory controller 110 may be toggled or swung at a predetermined (and/or otherwise determined) period tDQS. For example, the high level and low level of the data strobe signal DQS may be regularly repeated.

In addition, the training data TDAT received from the memory controller 110 may include a plurality of sub-training data STD1, STD2, . . . , STDN. For example, the plurality of sub-training data STD1, STD2, . . . , STDN may include the first to Nth sub-training data STD1, STD2, . . . , STDN, where N is a natural number greater than or equal to two.

The plurality of sub-training data STD1, STD2, . . . , STDN may include a plurality of data bits D11, . . . , D1K, D21, . . . , D2K, . . . , DN1, . . . , DNK. For example, the first sub-training data STD1 may be received during the time interval between t1 and t2, and may include K first data bits D11, . . . , D1K, where K is a natural number greater than or equal to two. The second sub-training data STD2 may be received during the time interval between t2 and t3, and may include K second data bits D21, . . . , D2K. The Nth sub-training data STDN may be received during the time interval between tN and tN+1, and may include K Nth data bits DN1, . . . , DNK.

For convenience, FIG. 5 illustrates that one data bit (e.g., D11) starts from the rising edge of the data strobe signal DQS and corresponds to one period tDQS, but the example embodiments are not limited thereto.

In some example embodiments, the sub-training data STD1, STD2, . . . , STDN may be identical to each other, the data bits D11, D21, . . . , DN1 may be identical to each other, and the data bits D1K, D2K, . . . , DNK may be identical to each other. In other words, the memory controller 110 may repeatedly transmit the same sub-training data.

In some example embodiments, some of the sub-training data STD1, STD2, . . . , STDN may be different from each other, some of the data bits D11, D21, . . . , DN1 may be different from each other, and/or some of the data bits D1K, D2K, . . . , DNK may be different from each other.

Figures 6, 7:
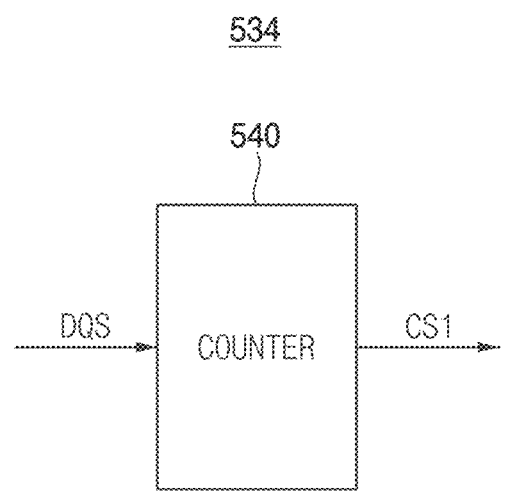
FIG. 6 is a block diagram illustrating an example of a data checking logic included in the buffer device in FIG. 4.
FIG. 7 is a diagram illustrating an example of an address-delay map included in an address-delay mapping logic included in the buffer device in FIG. 4.

FIG. 6 is a block diagram illustrating an example of a data checking logic included in the buffer device in FIG. 4.

Referring to FIG. 6, the data checking logic 534 may include a counter 540. The counter 540 may count the number of toggles of the data strobe signal DQS to generate the first control signal CS1. For example, the first control signal CS1 may be generated based on a count signal generated by counting the number of toggles of the data strobe signal DQS.

To identify one sub-training data (e.g., STD1), the number of data bits included in one sub-training data (e.g., D11, . . . , D1K) may be counted. For example, instead of directly counting the number of data bits, the number of toggles of the data strobe signal DQS (e.g., the number of rising edges and/or falling edges) may be counted.

For example, as illustrated in FIG. 5, when one sub-training data STD1 includes K data bits D11, . . . , D1K and when one data bit (e.g., D11) corresponds to one period tDQS of the data strobe signal DQS, it may be determined that one sub-training data STD1 is received when the data strobe signal DQS is toggled K times (e.g., when the period tDQS of the data strobe signal DQS is repeated K times).

For example, at an initial operation time, the value of the first control signal CS1 may be set to "0". When the number of toggles of the data strobe signal DQS is counted K times, the value of the first control signal CS1 may increase to "1", which may indicate that reception of the first sub-training data STD1 is completed. Similarly, when the number of toggles of the data strobe signal DQS is counted K times after the value of the first control signal CS1 increases to "1", the value of the first control signal CS1 may increase to "2", which may indicate that the reception of the second sub-training data STD2 is completed. When the number of toggles of the data strobe signal DQS is counted K*N times in total, it may indicate that reception of all of the first to Nth sub-training data STD1, STD2, . . . , STDN is completed.

For example, at an initial operation time, a value of the count signal may be set to "0," and the value may be increased by "1" each time the number of toggles of the data strobe signal DQS is counted. In some example embodiments, the value of the count signal may continue to increase up to K*N. In some example embodiments, the value of the count signal may increase to K, reset to "0" and then increase to K again.

FIG. 7 is a diagram illustrating an example of an address-delay map included in an address-delay mapping logic included in the buffer device in FIG. 4.

Referring to FIG. 7, an address-delay map 550 may indicate the correspondence between a plurality of sub-training data STD1, STD2, . . . , STDN, a plurality of addresses ADDR1, ADDR2, . . . , ADDRN set or assigned thereon, and a plurality of delays DLY1, DLY2, . . . , DLYN set or assigned thereon.

Similar to the plurality of sub-training data STD1, STD2, . . . , STDN, the plurality of addresses ADDR1, ADDR2, . . . , ADDRN may include first to Nth addresses ADDR1, ADDR2, . . . , ADDRN, and the plurality of delays DLY1, DLY2, . . . , DLYN may include first to Nth delays DLY1, DLY2, . . . , DLYN.

For example, the first address ADDR1 may be set on the first sub-training data STD1, and the first delay DLY1 may be set on the first sub-training data STD1. The second address ADDR2 may be set on the second sub-training data STD2, and the second delay DLY2 may be set on the second sub-training data STD2. The Nth address ADDRN may be set on the Nth sub-training data STDN, and the Nth delay DLYN may be set on the Nth sub-training data STDN.

In some example embodiments, the plurality of delays DLY1, DLY2, . . . , DLYN may be different from each other. For example, the second delay DLY2 may be greater than the first delay DLY1, and the Nth delay DLYN may be greater than the second delay DLY2. In other words, as i increases, i-th delay may increase. Accordingly, the delay code included in the second control signal CS2 may sequentially increase. However, example the embodiments are not limited thereto.

In some example embodiments, the plurality of addresses ADDR1, ADDR2, . . . , ADDRN may be different from each other. For example, the plurality of addresses ADDR1, ADDR2, . . . , ADDRN may indicate different locations (e.g., memory regions or storage spaces) of a single memory device, and each of the plurality of addresses ADDR1, ADDR2, . . . , ADDRN may indicate the same location of the plurality of memory devices 140.

Figure 8:
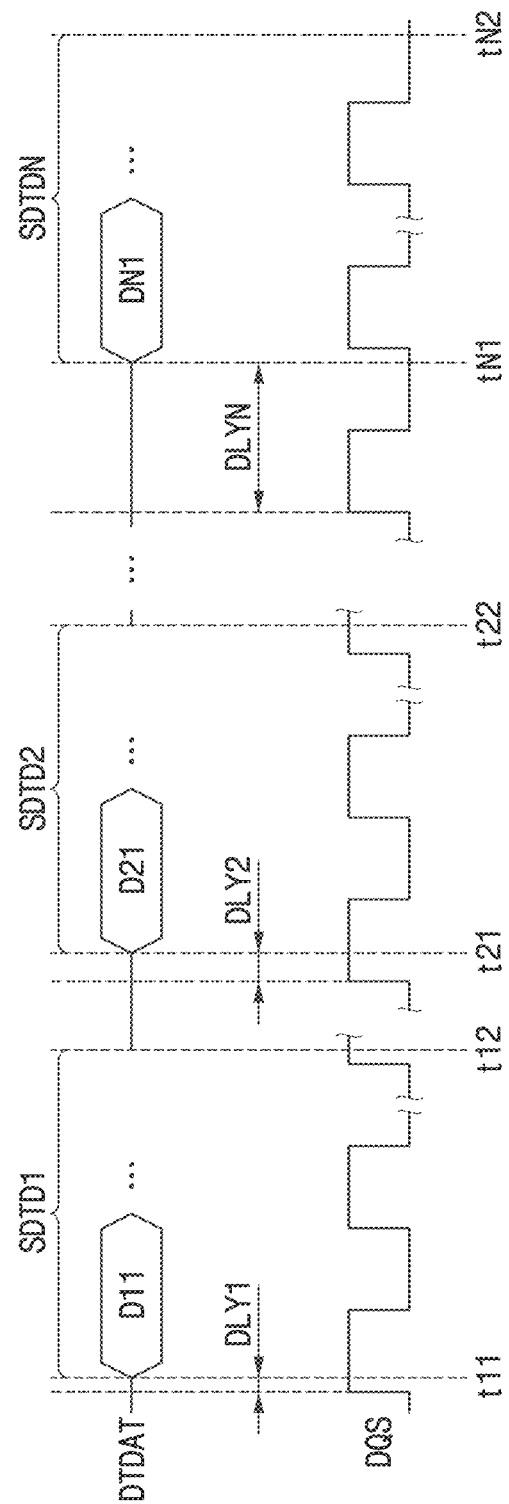
FIG. 8 is a diagram describing an operation of the buffer device in FIG. 4.

FIG. 8 is a diagram describing an operation of the buffer device in FIG. 4. Descriptions repeated with those of FIG. 5 will be omitted for brevity.

Referring to FIG. 8, the data strobe signal DQS output to the plurality of memory devices 140 may be substantially the same as the data strobe signal DQS in FIG. 5.

The delayed training data DTDAT output to the plurality of memory devices 140 may include a plurality of delayed sub-training data SDTD1, SDTD2, . . . , SDTDN in which a plurality of delays DLY1, DLY2, . . . , DLYN are set on a plurality of sub-training data STD1, STD2, . . . , STDN. For example, the plurality of delayed sub-training data SDTD1, SDTD2, . . . , SDTDN may include first to Nth delayed sub-training data SDTD1, SDTD2, . . . , SDTDN.

In the first delayed sub-training data SDTD1, the first delay DLY1 may be set on the first sub-training data STD1, and the first delayed sub-training data SDTD1 may be output during the time interval t11 to t12. Similar to the first sub-training data STD1, the first delayed sub-training data SDTD1 may include K first data bits D11, D12, . . . , D1K, and the length of the time interval t11 to t12 may be substantially the same as the length of the time interval t1 to t2 in FIG. 5.

Similarly, in the second delayed sub-training data SDTD2, the second delay DLY2 may be set on the second sub-training data STD2, and the second delayed sub-training data SDTD2 may be output during the time interval t21 to t22. Similar to the second sub-training data STD2, the second delayed sub-training data SDTD2 may include K second data bits D21, D22, . . . , and D2K, and the length of the time interval t21 to t22 may be substantially the same as the length of the time interval t2 to t3 in FIG. 5.

In the Nth delayed sub-training data SDTDN, the Nth delay DLYN may be set on the Nth sub-training data STDN, and the Nth delayed sub-training data SDTDN may be output during the time interval tN1 to tN2. Similar to the Nth sub-training data STDN, the Nth delayed sub-training data SDTDN may include K Nth data bits DN1, DN2, . . . , DNK, and the length of the time interval tN1 to tN2 may be substantially the same as the length of the time interval tN to tN+1 in FIG. 5.

For convenience, FIG. 8 illustrates that the delays DLY1, DLY2, . . . , DLYN are set based on the rising edge of the data strobe signal DQS, and the delays DLY1, DLY2, . . . , DLYN gradually increase over time. However, the example embodiments are not limited thereto.

FIGS. 9A, 9B, 9C, 10A, 10B, 10C, 11A, 11B and 11C are diagrams describing an operation of a memory package including the buffer device in FIG. 4.

Figure 9A:
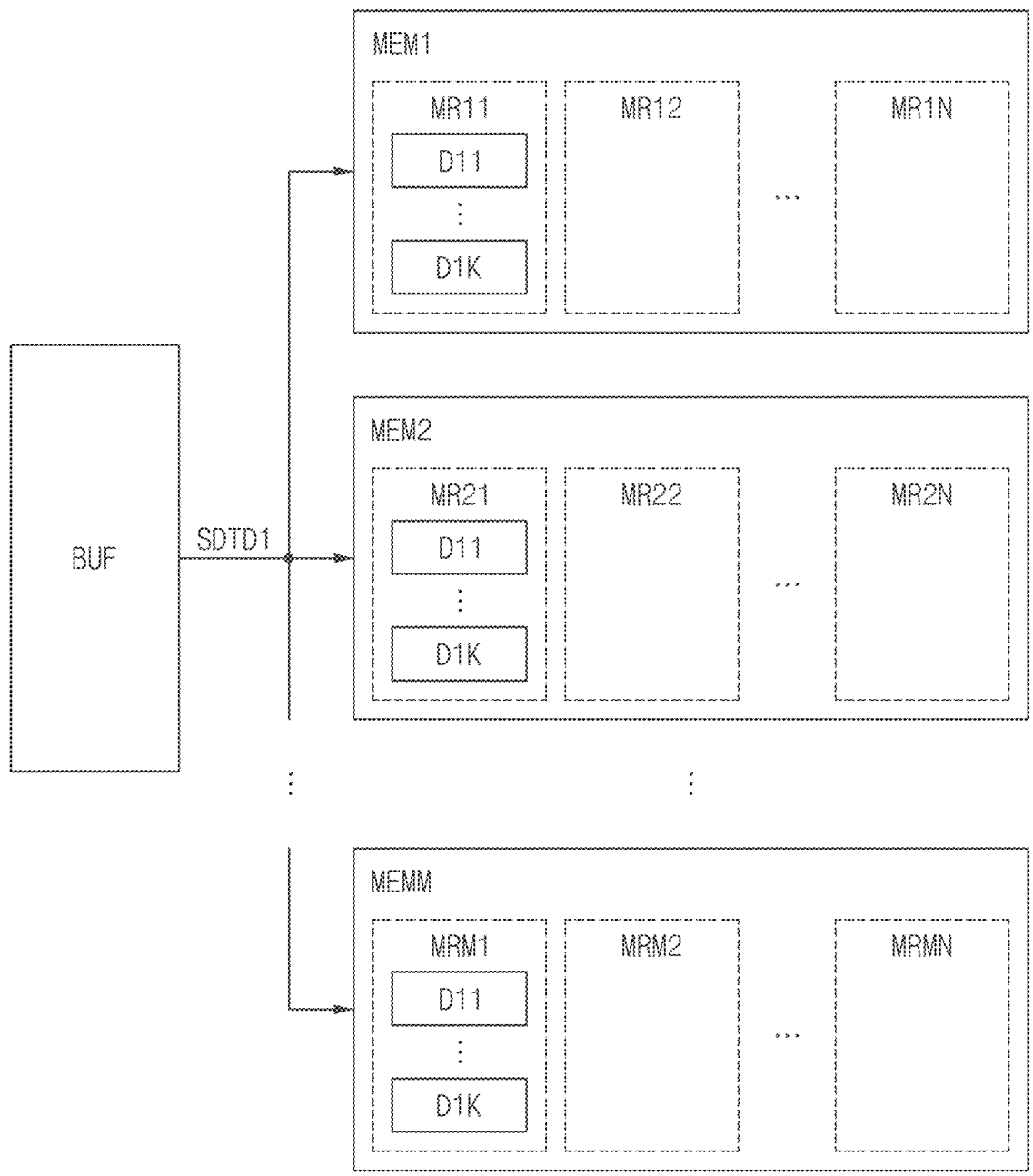
FIGS. 9A, 9B, 9C, 10A, 10B, 10C, 11A, 11B and 11C are diagrams describing an operation of a memory package including the buffer device in FIG. 4.
Figure 9B:
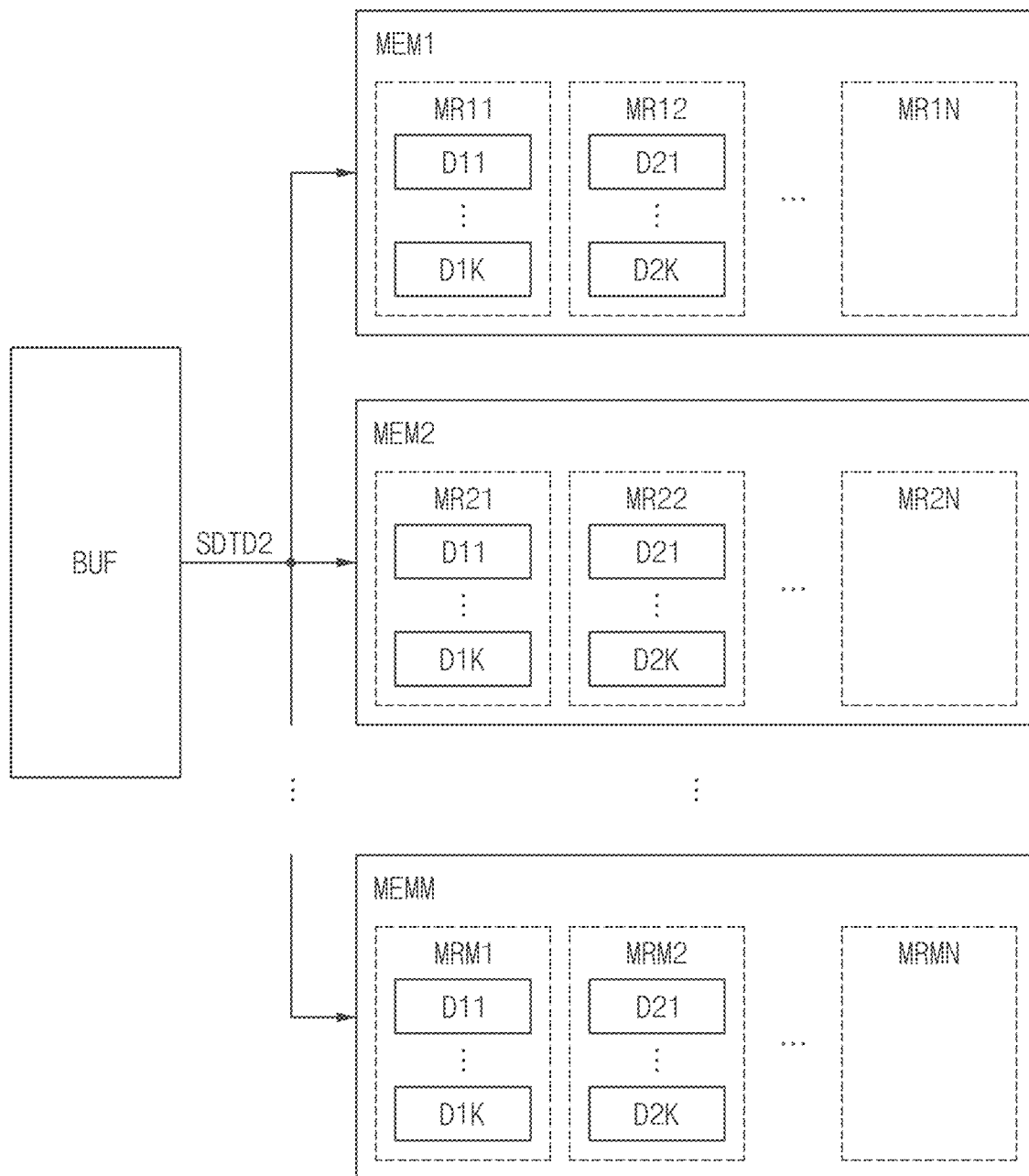
Figure 9C:
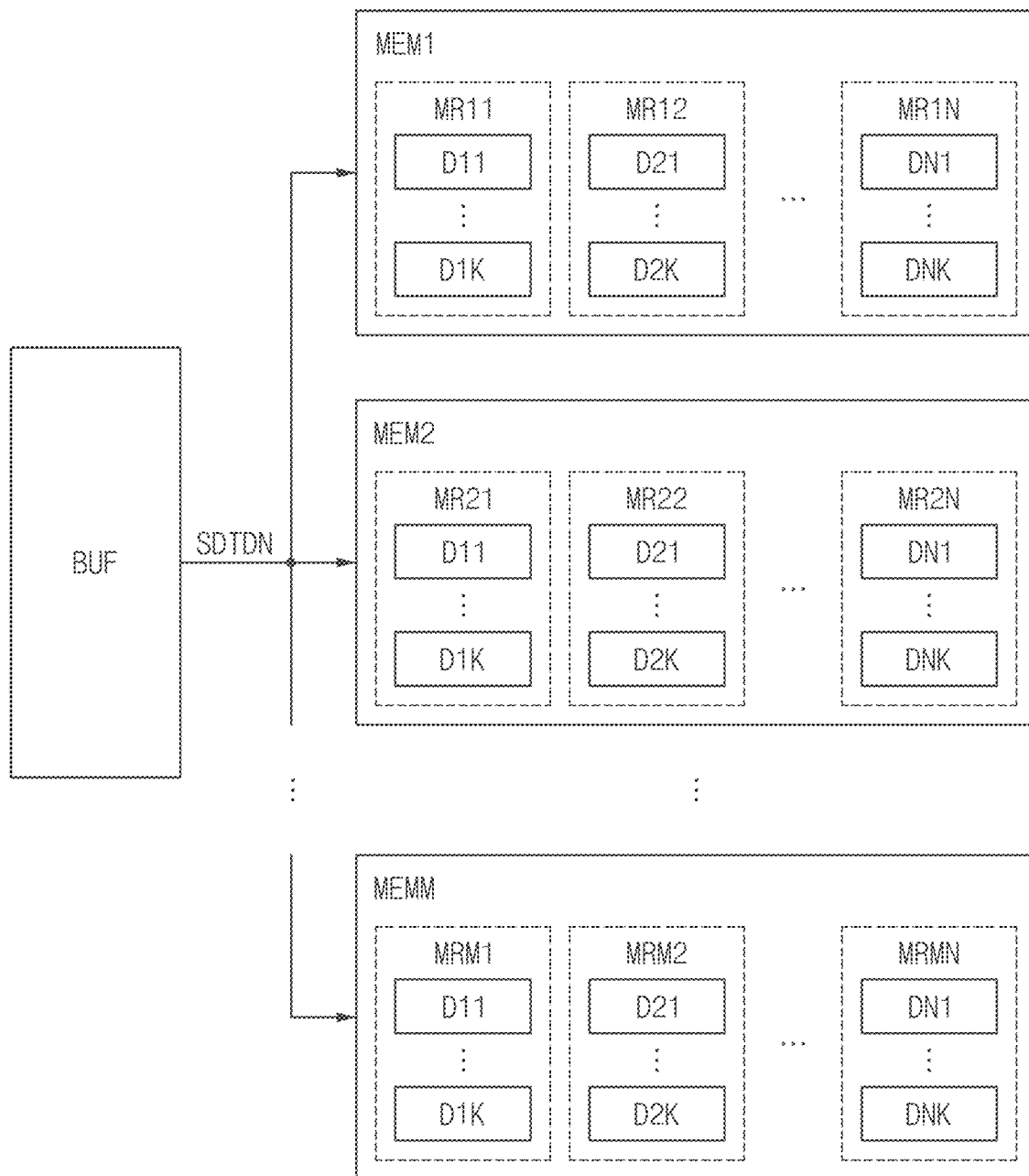

Referring to FIGS. 9A, 9B, and 9C, an example of transmitting and storing data from a buffer device BUF to a plurality of memory devices MEM1, MEM2, . . . , MEMM during the training operation is shown, and a one-shot training method is illustrated. For example, the plurality of memory devices MEM1, MEM2, . . . , MEMM may include first to Mth memory device MEM1, MEM2, . . . , MEMM, where M is a natural number greater than or equal to 2.

As shown in FIG. 9A, the first sub-training data STD1 on which the first delay DLY1 is set (e.g., the first delayed sub-training data SDTD1) may be simultaneously transmitted from the buffer device BUF to the plurality of memory devices MEM1, MEM2, . . . , MEMM. Accordingly, the first data bits D11, . . . , D1K included in the first delayed sub-training data SDTD1 may be written/stored in memory regions MR11, MR21, . . . , MRM1 of the plurality of memory devices MEM1, MEM2, . . . , MEMM. For example, the memory regions MR11, MR21, . . . , MRM1 may correspond to the first address ADDR1 and may indicate the same first location in the plurality of memory devices MEM1, MEM2, . . . , MEMM.

And then, as shown in FIG. 9B, the second sub-training data STD2 on which the second delay DLY2 is set (e.g., the second delayed sub-training data SDTD2) may be simultaneously transmitted from the buffer device BUF to the plurality of memory devices MEM1, MEM2, . . . , MEMM. Accordingly, the second data bits D21, . . . , D2K included in the second delayed sub-training data SDTD2 may be written/stored in memory regions MR12, MR22, . . . , MRM2 of the plurality of memory devices MEM1, MEM2, . . . , MEMM. For example, the memory regions MR12, MR22, . . . , MRM2 may correspond to the second address ADDR2 and may indicate the same second location in the plurality of memory devices MEM1, MEM2, . . . , MEMM.

Furthermore, as shown in FIG. 9C, the Nth sub-training data STDN on which the Nth delay DLYN is set (e.g., the Nth delayed sub-training data SDTDN) may be simultaneously transmitted from the buffer device BUF to the plurality of memory devices MEM1, MEM2, . . . , MEMM. Accordingly, the Nth data bits DN1, . . . , DNK included in the Nth delayed sub-training data SDTDN may be written/stored in memory regions MR1N, MR2N, . . . , MRMN of the plurality of memory devices MEM1, MEM2, . . . , MEMM. For example, the memory regions MR1N, MR2N, . . . , MRMN may correspond to the Nth address ADDRN and may indicate the same Nth location in the plurality of memory devices MEM1, MEM2, . . . , MEMM.

According to the above-described one-shot training method, training may be performed for all the memory devices at once by performing not only temporal training in the time domain but also positional (or spatial) training in the address domain, e.g., by using the mapping of the address domain and the time domain.

Figure 10A:
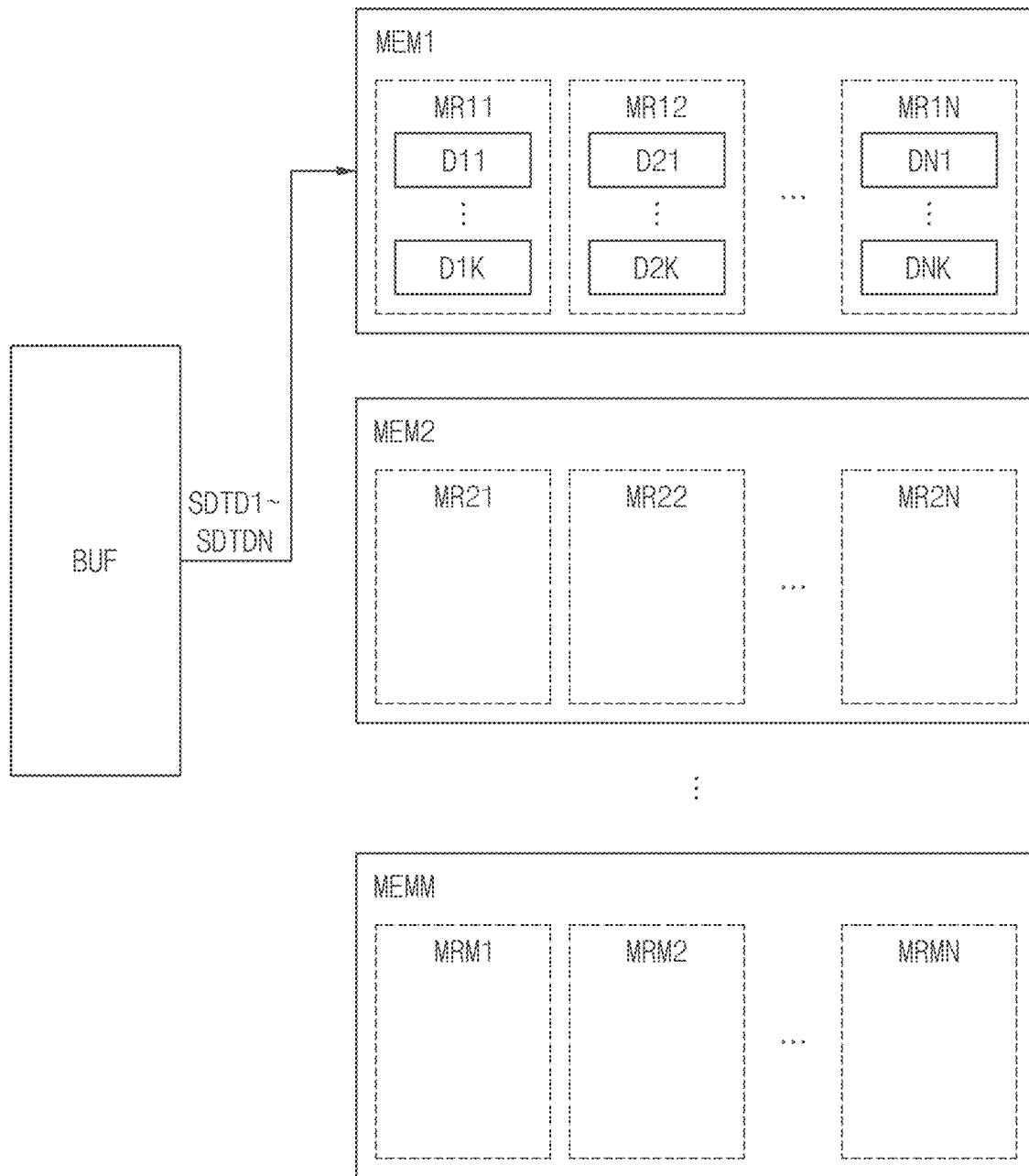
Figure 10B:
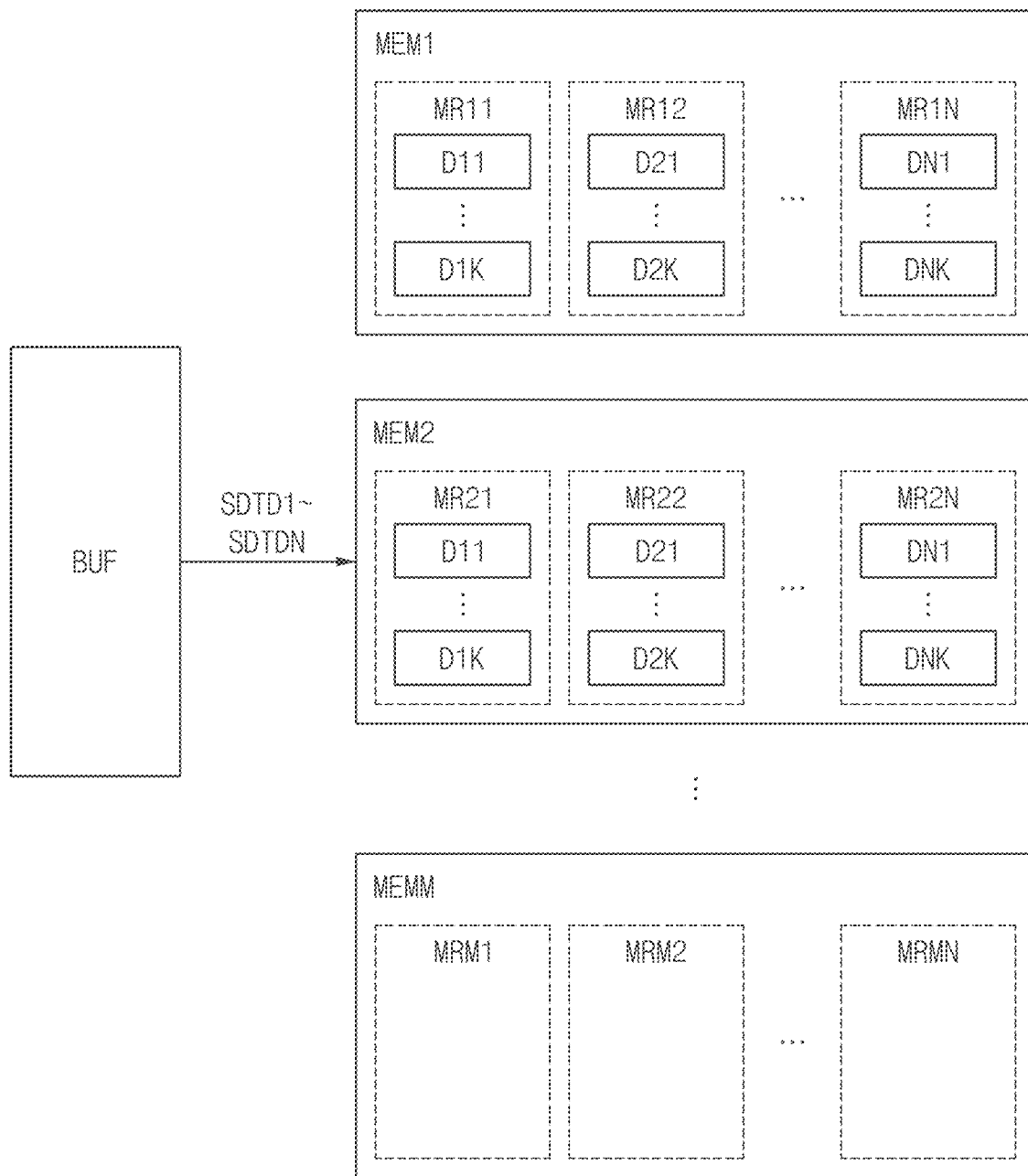
Figure 10C:
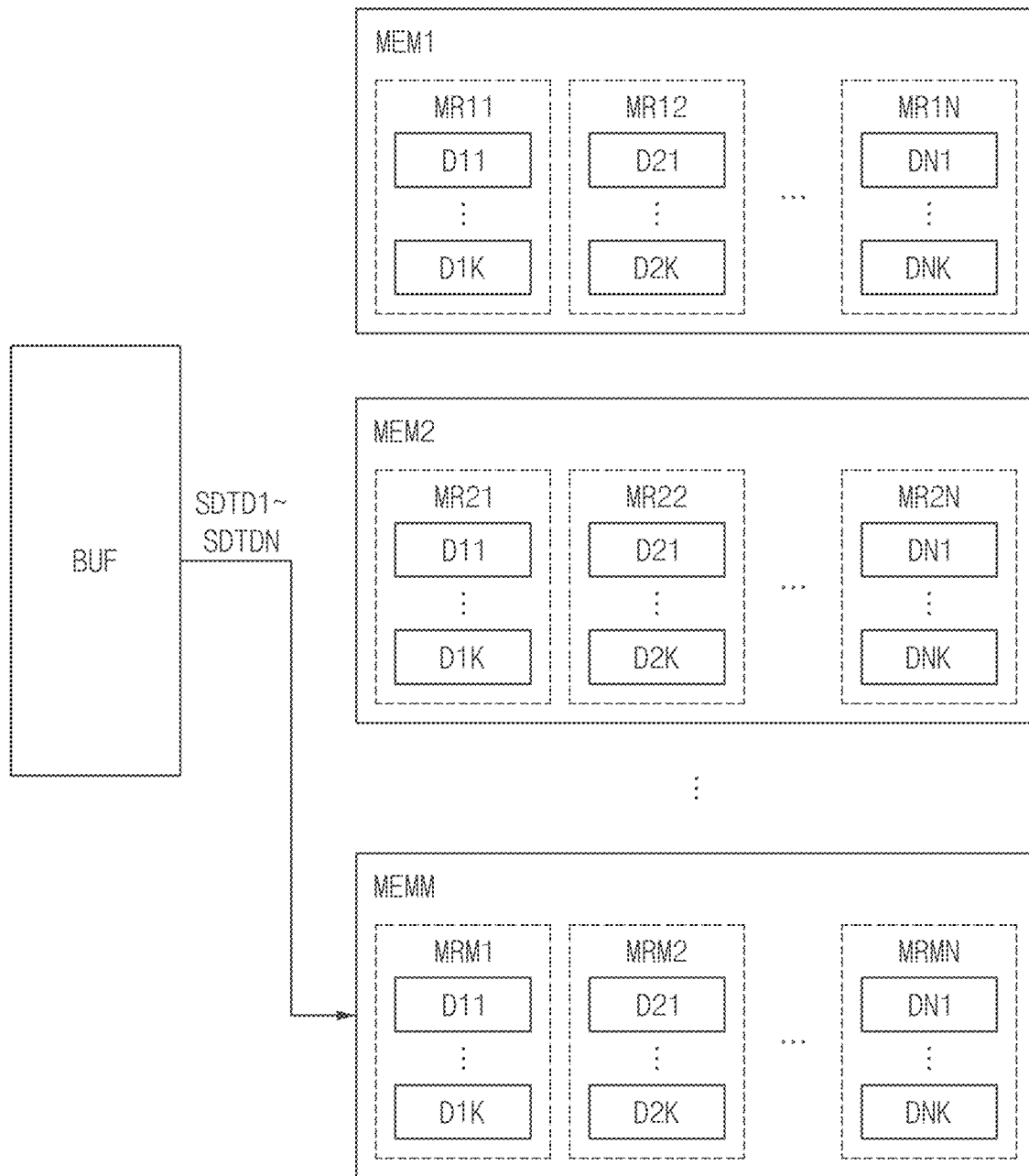

Referring to FIGS. 10A, 10B and 10C, an example of the buffer device BUF transmitting data to the plurality of memory devices MEM1, MEM2, . . . , MEMM, and the data being stored in the plurality of memory devices MEM1, MEM2, . . . , MEMM during the training operation is shown, and the sequential training method is illustrated. Descriptions repeated with those of FIGS. 9A, 9B, and 9C will be omitted.

As shown in FIG. 10A, the first memory device MEM1 may be selected from among the plurality of memory devices MEM1, MEM2, . . . , MEMM, and the first to Nth delayed sub-training data SDTD1, SDTD2, . . . , SDTDN may be sequentially transmitted from the buffer device BUF to the first memory device MEM1. Accordingly, the data bits D11, . . . , D1K, D21, . . . , D2K, . . . , DN1, . . . , DNK included in the delayed sub-training data SDTD1, SDTD2, . . . , SDTDN may be sequentially written/stored in the memory regions MR11, MR12, . . . , MR1N of the first memory device MEM1.

And then, as shown in FIG. 10B, the second memory device MEM2 may be selected from among the plurality of memory devices MEM1, MEM2, . . . , MEMM, and the first to Nth delayed sub-training data SDTD1, SDTD2, . . . , SDTDN may be sequentially transmitted from the buffer device BUF to the second memory device MEM2. Accordingly, the data bits D11, . . . , D1K, D21, . . . , D2K, . . . , DN1, . . . , DNK may be sequentially written/stored in the memory regions MR21, MR22, . . . , MR2N of the second memory device MEM2.

Furthermore, as shown in FIG. 10C, the Mth memory device MEMM may be selected from among the plurality of memory devices MEM1, MEM2, . . . , MEMM, and the first to Nth delayed sub-training data SDTD1, SDTD2, . . . , SDTDN may be sequentially transmitted from the buffer device BUF to the Mth memory device MEMM. Accordingly, the data bits D11, . . . , D1K, D21, . . . , D2K, . . . , DN1, . . . , DNK may be sequentially written/stored in the memory regions MRM1, MRM2, . . . , MRMN of the Mth memory device MEMM.

The address-delay mapping method according to some example embodiments may be applied not only to the one-shot training method in FIGS. 9A, 9B, and 9C but also to the sequential training method in FIGS. 10A, 10B, and 10C.

Figure 11A:
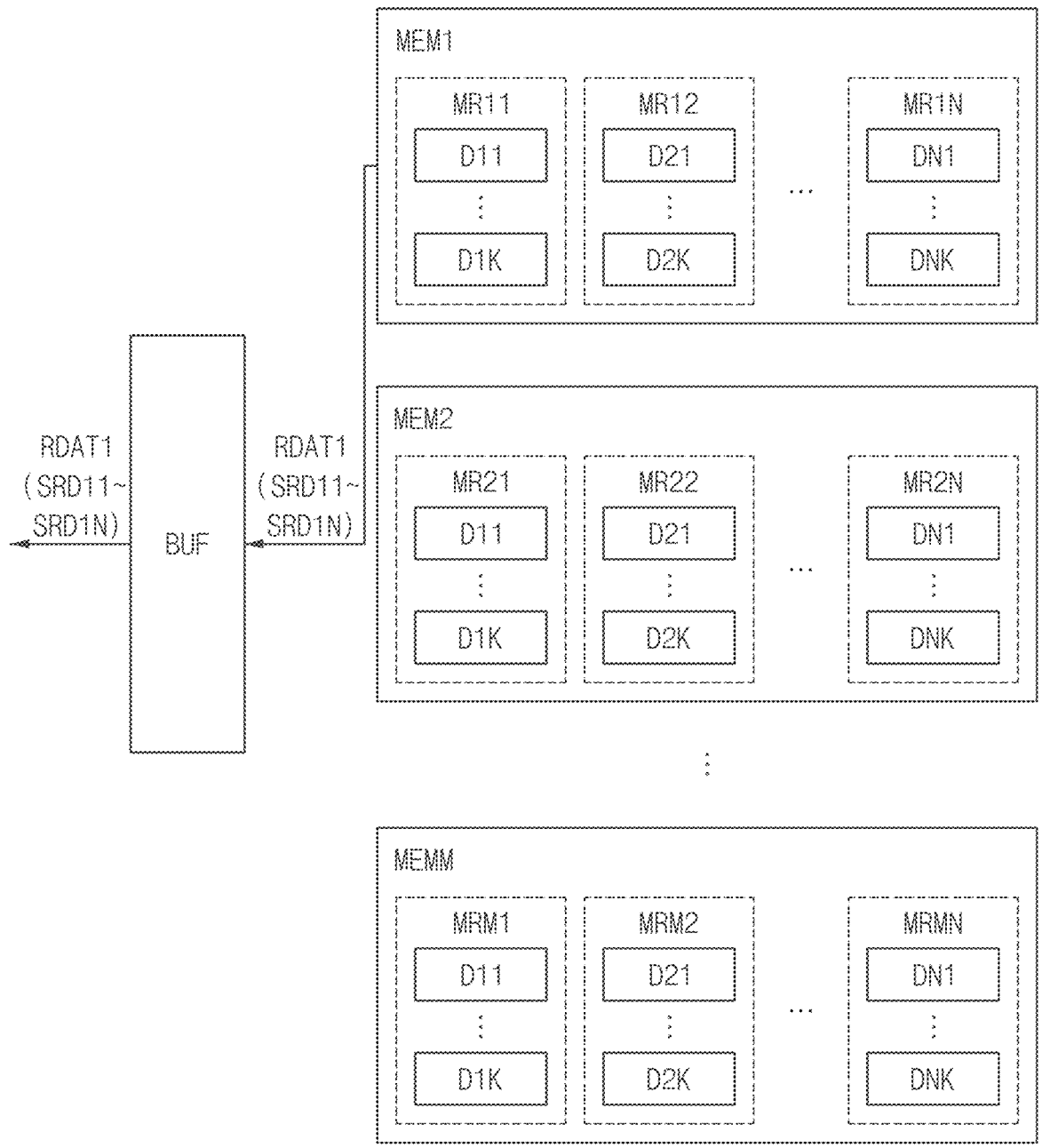
Figure 11B:
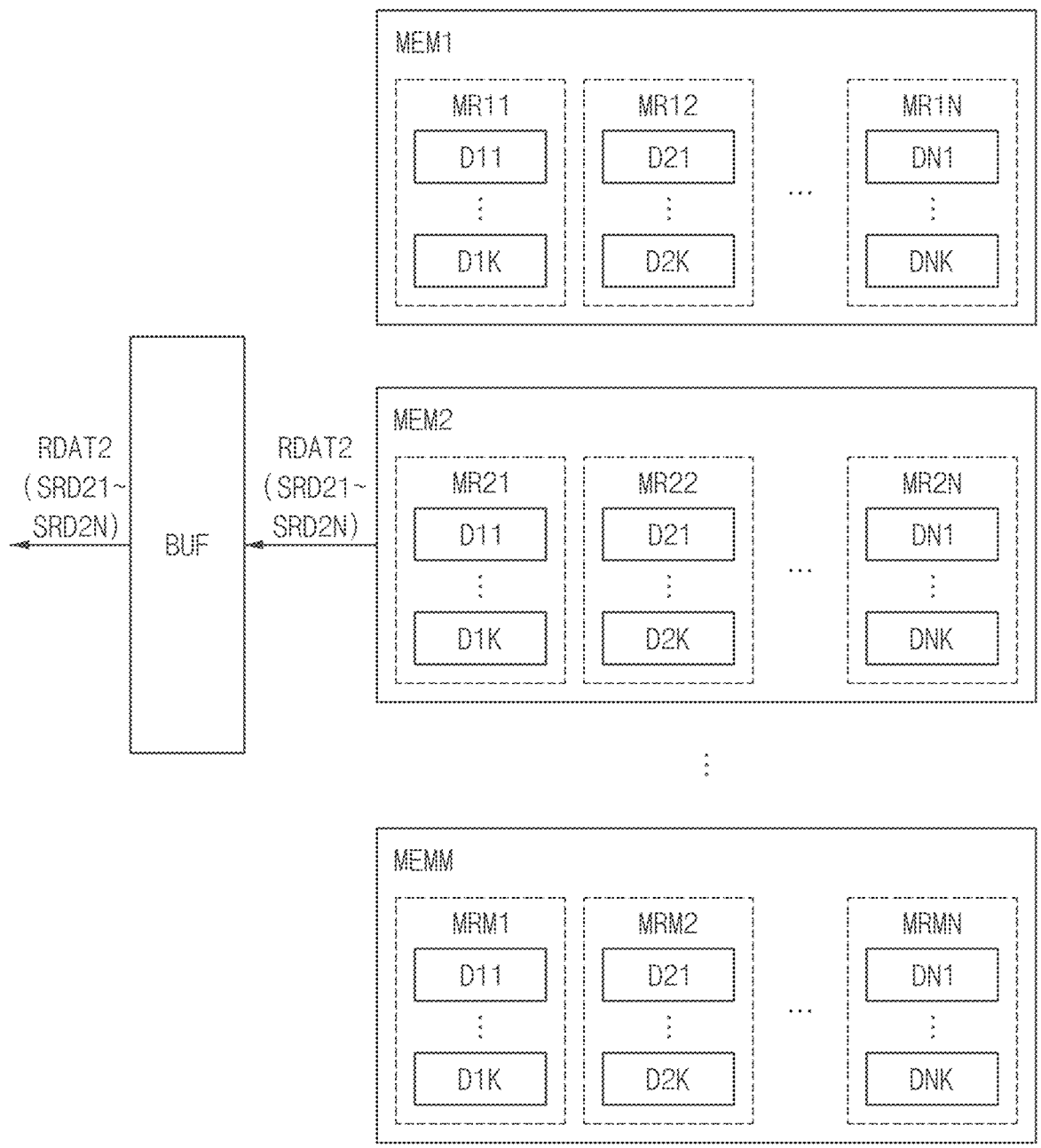
Figure 11C:
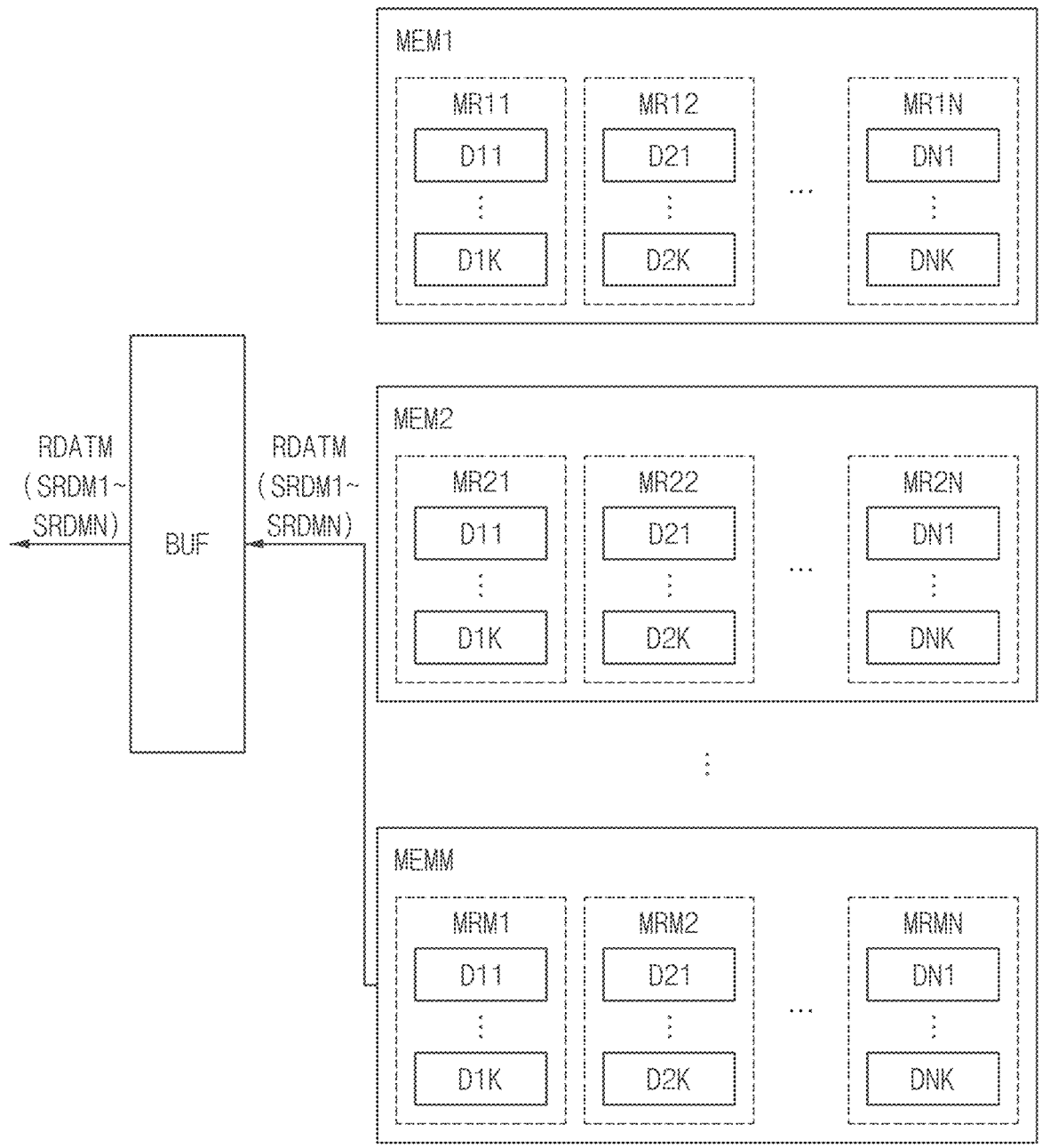

Referring to FIGS. 11A, 11B, and 11C, an example of the buffer device BUF receiving data from the plurality of memory devices MEM1, MEM2, . . . , MEMM and outputting the data during the training operation is shown.

As shown in FIG. 11A, the first memory device MEM1 may be selected from among the plurality of memory devices MEM1, MEM2, . . . , MEMM, and the buffer device BUF may receive first read training data RDAT1 corresponding to the training data TDAT and read from the first memory device MEM1, and may output the first read training data RDAT1 to the memory controller 110. For example, the first read training data RDAT1 may include sub read training data SRD11 corresponding to the data bits D11, . . . , D1K stored in the memory region MR11, sub read training data SRD12 corresponding to the data bits D21, . . . , D2K stored in the memory region MR12, and sub read training data SRD1N corresponding to the data bits DN1, . . . , DNK stored in the memory region MR1N. For example, the data bits D11, . . . , D1K, D21, . . . , D2K, . . . , DN1, . . . , DNK included in the first read training data RDAT1 may or may not coincide with the data bits D11, . . . , D1K, D21, . . . , D2K, . . . , DN1, . . . , DNK included in the training data TDAT.

And then, as shown in FIG. 11B, the second memory device MEM2 may be selected from among the plurality of memory devices MEM1, MEM2, . . . , MEMM, and the buffer device BUF may receive second read training data RDAT2 corresponding to the training data TDAT and read from the second memory device MEM2, and may output the second read training data RDAT2 to the memory controller 110. For example, the second read training data RDAT2 may include sub read training data SRD21 corresponding to the data bits D11, . . . , D1K stored in the memory region MR21, sub read training data SRD22 corresponding to the data bits D21, . . . , D2K stored in the memory region MR22, and sub read training data SRD2N corresponding to the data bits DN1, . . . , DNK stored in the memory region MR2N.

Furthermore, as shown in FIG. 11C, the Mth memory device MEMM may be selected from among the plurality of memory devices MEM1, MEM2, . . . , MEMM, and the buffer device BUF may receive Mth read training data RDATM corresponding to the training data TDAT and read from the Mth memory device MEMM, and may output the Mth read training data RDATM to the memory controller 110. For example, the Mth read training data RDATM may include sub read training data SRDM1 corresponding to the data bits D11, . . . , D1K stored in the memory region MRM1, sub read training data SRDM2 corresponding to the data bits D21, . . . , D2K stored in the memory region MRM2, and sub read training data SRDMN corresponding to the data bits DN1, . . . , DNK stored in the memory region MRMN.

Figure 13A:
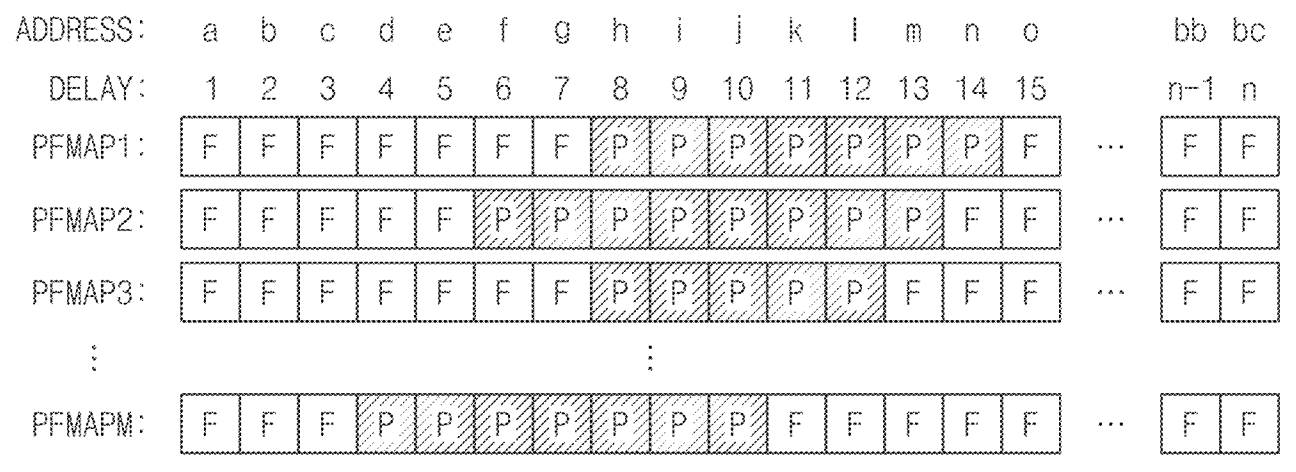
Figure 13B:
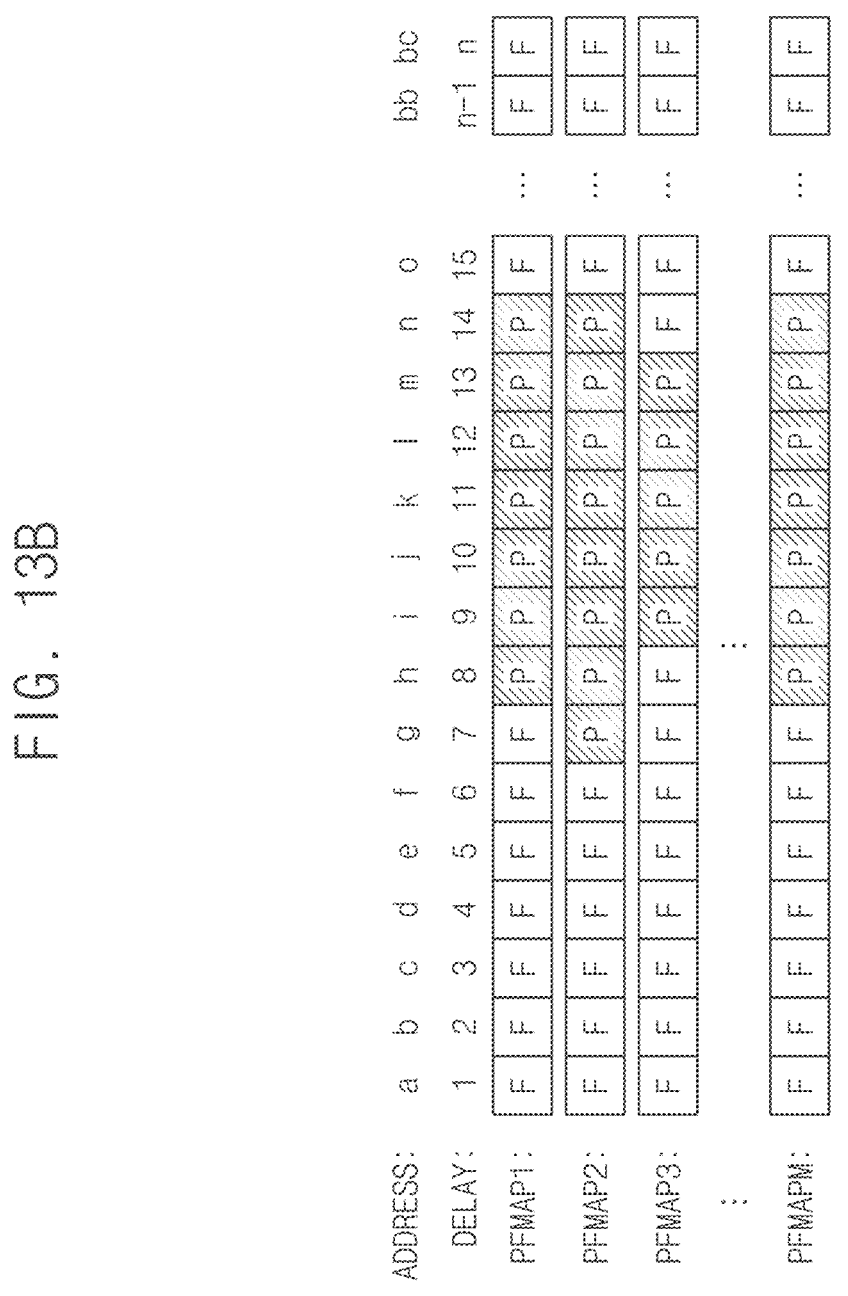

FIGS. 12, 13A and 13B are diagrams describing an operation of a memory system including the buffer device in FIG. 4.

Referring to FIGS. 12, 13A, and 13B, an example of the memory controller 110 obtaining a plurality of pass/fail maps and a plurality of training values on the plurality of memory devices MEM1, MEM2, . . . , MEMM during the training operation is shown.

As shown in FIG. 12, the memory controller 110 (e.g., training control circuit 112) may obtain the plurality of pass/fail maps for the plurality of the memory devices MEM1, MEM2, . . . , MEMM by comparing a plurality of sub-training data STD1, STD2, . . . , STDN included in the training data TDAT with a plurality of sub read training data SRD11, SRD12, . . . , SRD1N, SRD21, SRD22, . . . , SRD2N, . . . , SRDM1, SRDM2, . . . , SRDMN included in a plurality of read training data RDAT1, RDAT2, . . . , RDATM.

For example, in obtaining a pass/fail map for the memory device MEM1, the sub-read training data SRD11 may be set to fail (F) if the sub-training data STD1 and the sub-read training data SRD11 do not match, and the sub read training data SRD12 may be set to pass (P) if the sub-training data STD2 and the sub-read training data SRD12 match. In a similar manner, all of the sub-read training data SRD11, SRD12, . . . , SRD1N may be set to pass or fail. In the above-described manner, pass/fail maps may be obtained for all of the memory devices MEM1, MEM2, . . . , MEMM.

And then, based on the address-delay map representing a relationship between the sub-training data STD1, STD2, . . . , STDN, addresses ADDR1, ADDR2, . . . , ADDRN and delays DLY1, DLY2, . . . , DLYN, optimal training values (e.g., delay values) for the memory devices MEM1, MEM2, . . . , MEMM may be obtained. For example, the training values may be set such that valid windows representing pass regions (e.g., regions where the pass P is set) of the memory devices MEM1, MEM2, . . . , MEMM coincide or are aligned.

Referring to FIGS. 13A and 13B, FIG. 13A illustrates an example of the plurality of pass/fail maps before the training operation, and FIG. 13B illustrates an example of the plurality of pass/fail maps after the training operation. In FIGS. 13A and 13B, addresses a, b, c, d, e, f, g, h, I, j, k, l, m, n, o, . . . , bb, bc and corresponding delays 1, 2, 3, 4, 5, 6, 7, 8, 9, 10, 11, 12, 13, 14, 15, . . . , n−1, n are provided as an example.

As shown in FIG. 13A, before the training operation, pass/fail maps PFMAP1, PFMAP2, PFMAP3, . . . , PFMAPM of the memory devices MEM1, MEM2, . . . , MEMM may be obtained as shown, and valid windows corresponding to the shaded areas may not be aligned.

In contrast, as shown in FIG. 13B, after the training operation, the pass/fail maps PFMAP1, PFMAP2, PFMAP3, . . . , PFMAPM of the memory devices MEM1, MEM2, . . . , MEMM may be obtained as shown, pass regions of the pass/fail maps PFMAP2, PFMAP3, . . . , PFMAPM may be shifted with respect to the pass/fail map PFMAP1, and valid windows corresponding to the shaded areas may be relatively aligned.

The memory controller 110 (e.g., the training control circuit 112) may set optimal training values (e.g., delay values) on the memory devices MEM1, MEM2, . . . , MEMM based on the address delay map so that the pass/fail maps in FIG. 13A are modified as the pass/fail maps in FIG. 13B.

Figure 14:
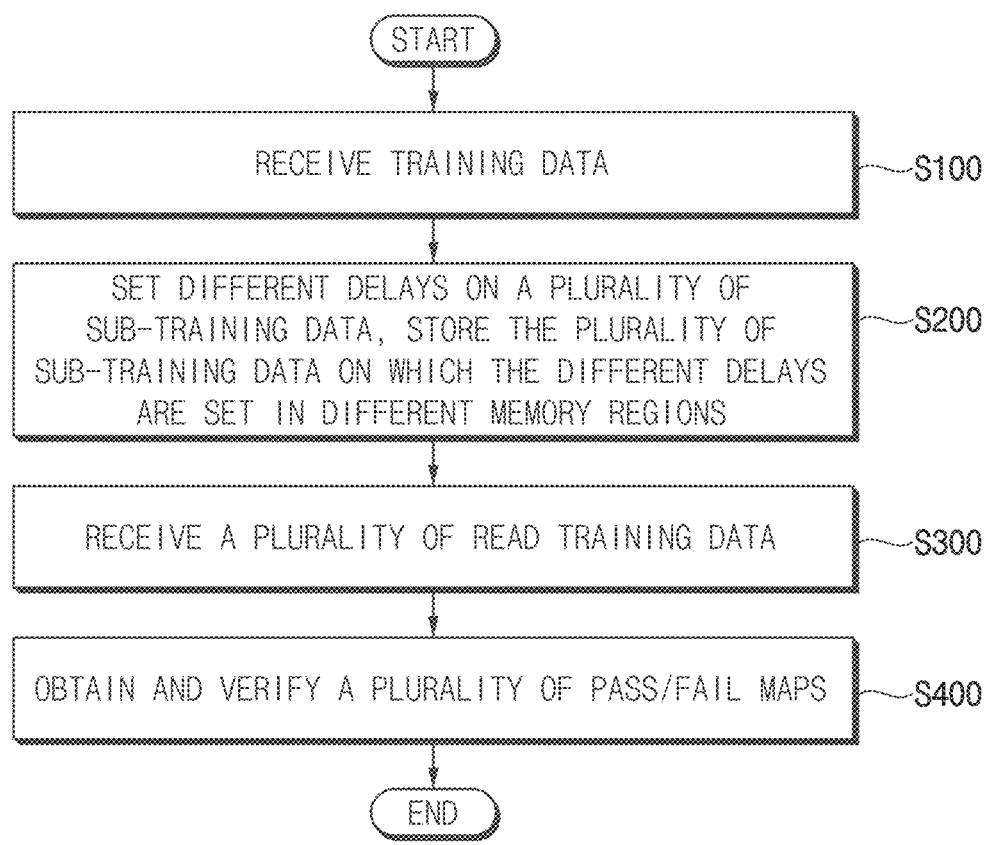
FIG. 14 is a flowchart illustrating a method of training a memory package according to some example embodiments.

FIG. 14 is a flowchart illustrating a method of training a memory package according to some example embodiments.

Referring to FIGS. 1 and 14, in a method of training a memory package according to some example embodiments, the buffer device 130 receives the data signal DQ including the training data TDAT and the data strobe signal DQS (operation S100). The buffer device 130 sets the delays that are different from each other on the plurality of sub-training data included in the training data TDAT and the plurality of sub-training data on which the delays are set are stored in different memory regions of the plurality of memory devices 140 (operation S200). The buffer device 130 receives the plurality of read training data RDAT corresponding to the training data TDAT from the plurality of memory devices 140 (operation S300) and outputs the plurality of read training data RDAT to the memory controller 110. The memory controller 110 obtains and verifies a plurality of pass/fail maps on the plurality of memory devices 140 based on the training data TDAT, the plurality of read training data RDAT, and the address-delay map ADM (operation S400). The memory controller 110 acquires and sets optimal training values (e.g., delay values) on the plurality of memory devices 140 based on the plurality of pass/fail maps.

Figure 15:
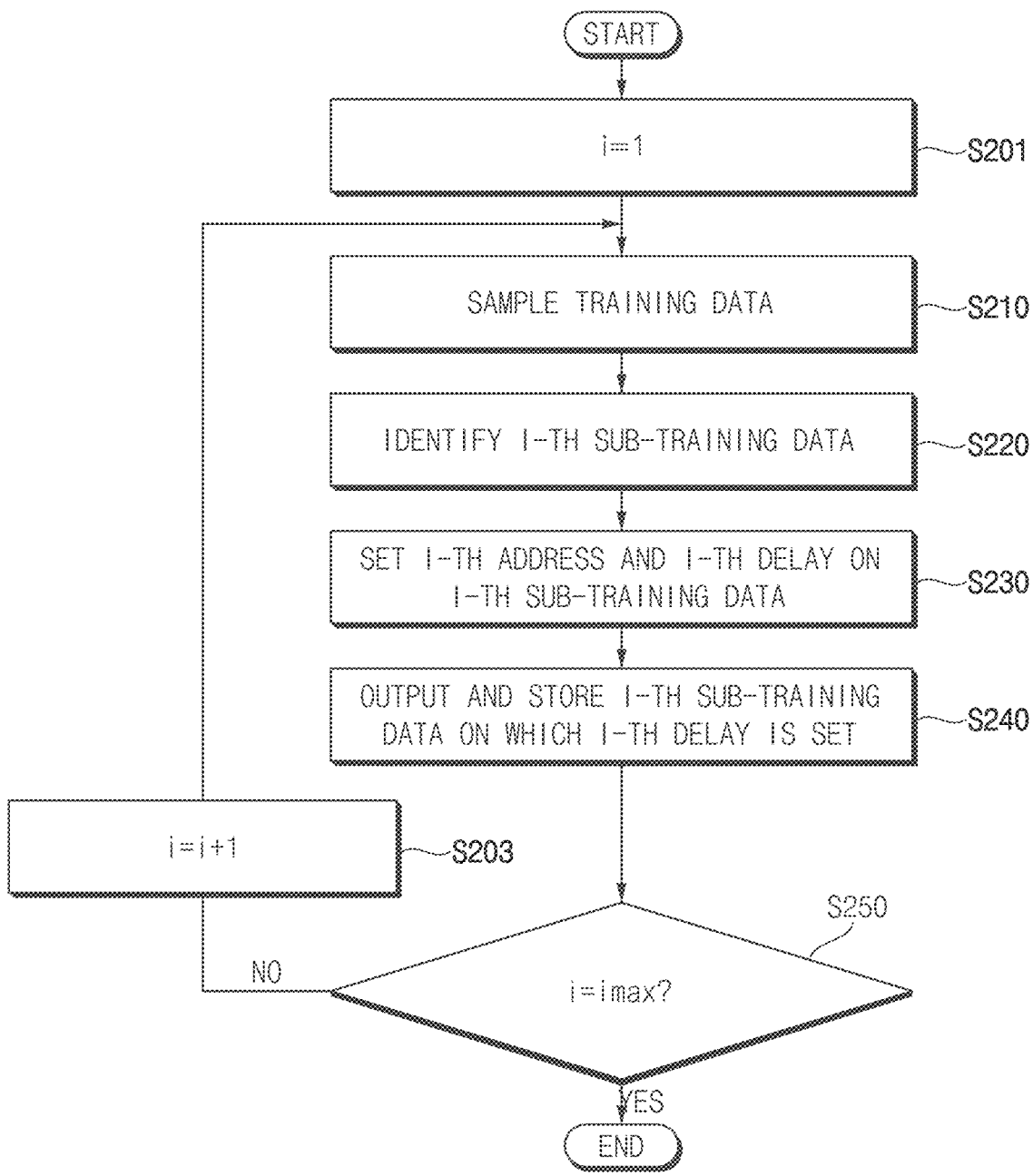
FIG. 15 is a flowchart illustrating an example of S200 in FIG. 14.

FIG. 15 is a flowchart illustrating an example of S200 in FIG. 14.

Referring to FIGS. 4, 14, and 15, in step S200, i may be set to 1 in an initial operation time (operation S201). The sampler 532 may sample the training data TDAT based on the data signal DQ and the data strobe signal DQS step (operation S210). The data checking logic 534 may identify the i-th sub-training data included in the training data TDAT based on the data strobe signal DQS (operation S220) and may generate the first control signal CS1. The address-delay mapping logic 536 may assign or set an i-th address and an i-th delay on an i-th sub-training data based on the first control signal CS1 (operation S230) and may generate the second control signal CS2 including a delay code. The delay logic 538 may output the i-th sub-training data on which the i-th delay is set based on the sampled training data SDAT and the second control signal CS2, and the i-th sub-training data on which the i-th delay is set may be stored in the memory region of the memory devices 140 corresponding to the i-th address (operation S240).

If the value of i is smaller than the maximum value imax (e.g., N) (operation S250: No), the value of i may be increased by 1 (operation S203), and steps S210, S220, S230, and S240 may be repeated. If the value of i is equal to the maximum value imax (operation S250: Yes), e.g., when all the sub-training data have been output and stored, the execution of step S200 may be completed.

Figure 16:
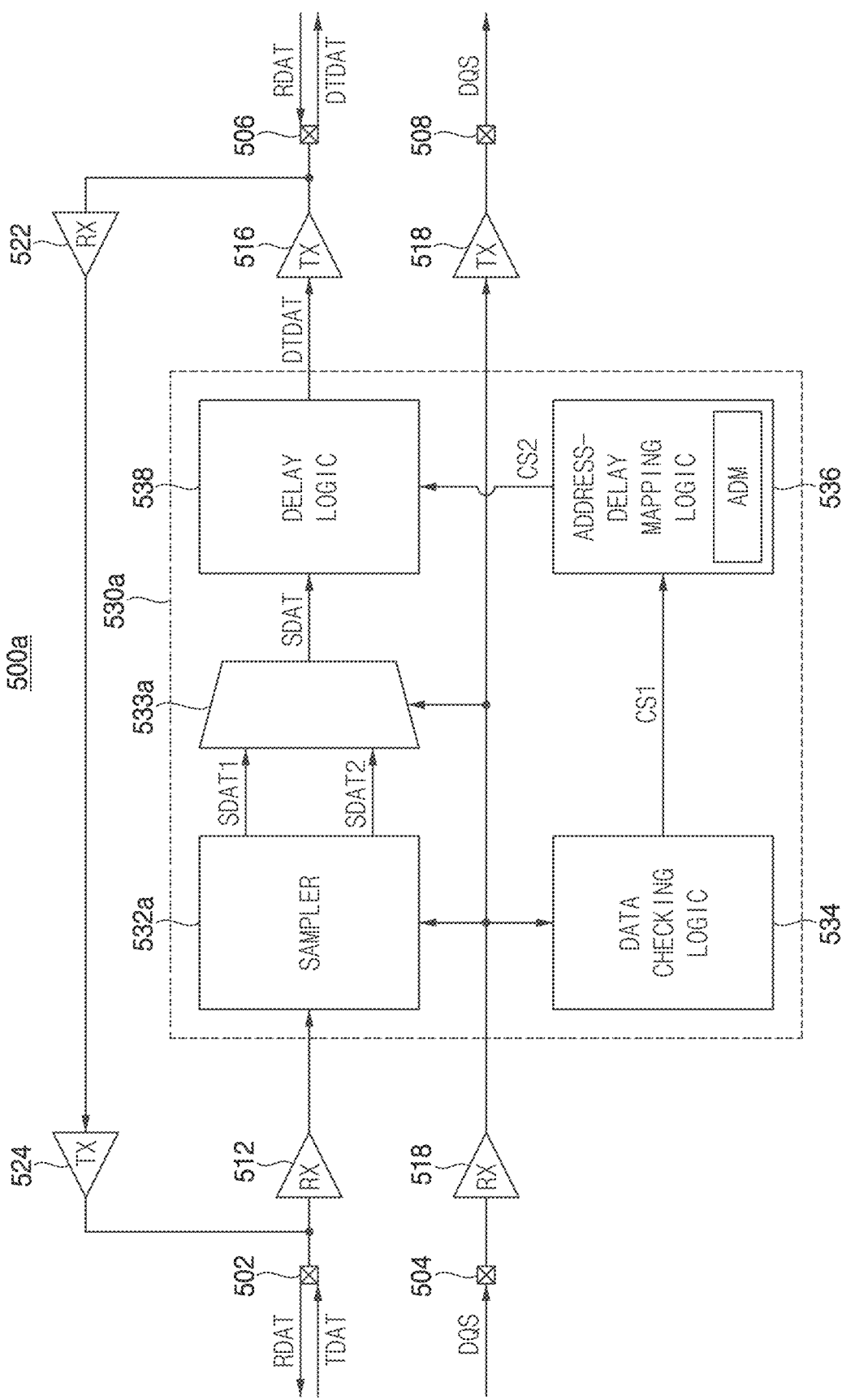
FIG. 16 is a block diagram illustrating an example of a buffer device included in a memory package according to some example embodiments.

FIG. 16 is a block diagram illustrating an example of a buffer device included in a memory package according to some example embodiments. Descriptions repeated with those of FIG. 4 will be omitted.

Referring to FIG. 16, a buffer device 500a may include data input/output pins 502 and 506, data strobe pins 504 and 508, receivers 512, 514, and 522, transmitters 516, 518, and 524, and a training circuit 530a. The training circuit 530a may include a sampler 532a, a multiplexer 533a, a data checking logic 534, an address-delay mapping logic 536, and a delay logic 538.

The sampler 532a is configured to sample the training data TDAT in a double data rate (DDR) method based on the data signal DQ and the data strobe signal DQS and to output sampled training data SDAT1 and SDAT2. The multiplexer 533a is configured to select one of the sampled training data SDAT1 and SDAT2 based on the data strobe signal DQS and to output the selected sampled training data as sampled training data SDAT.

Figure 17:
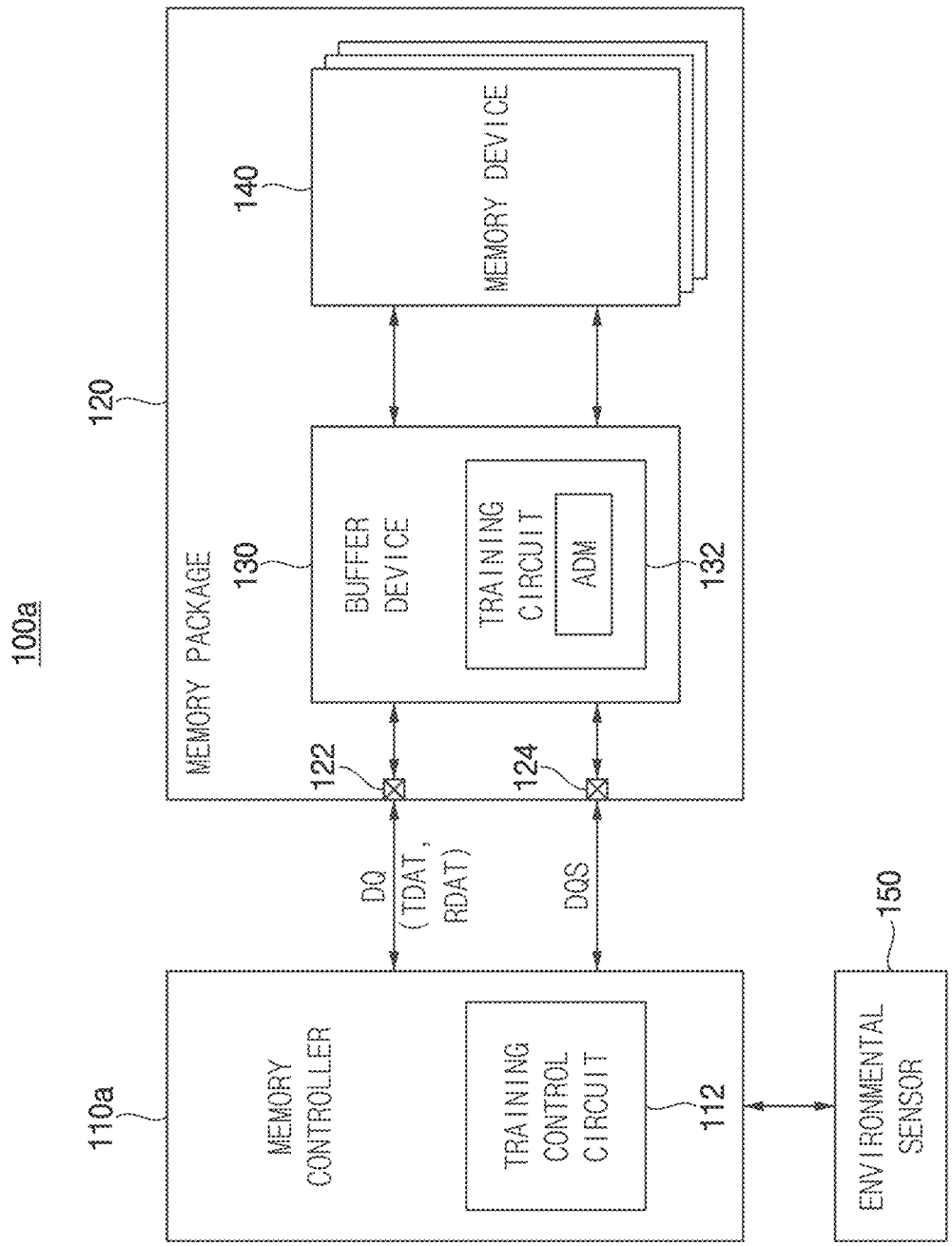
FIG. 17 is a block diagram illustrating a memory package and a memory system including a memory package according to some example embodiments.

FIG. 17 is a block diagram illustrating a memory package and a memory system including a memory package according to some example embodiments. Descriptions repeated with those of FIG. 1 will be omitted.

Referring to FIG. 17, a memory system 100a includes a memory controller 110a, a memory package 120, and an environmental sensor 150.

The environmental sensor 150 may detect changes in the operating environment of the memory system 100a (e.g., a temperature rise and/or humidity rise). The memory controller 110a may perform the training operation when the changes in the operating environment of the memory system 100a is detected.

In some example embodiments, the environmental sensor 150 may include at least one of a temperature sensor, humidity sensor, pressure sensor, motion sensor, time sensor, spatial sensor, illuminance sensor, accelerometer, vibration sensor, external force (mechanical stress) sensor, shock sensor, and/or the like. For example, the operating environment may include at least one of temperature, humidity, pressure, motion, time, space, illuminance, acceleration, vibration, external force, shock, and/or the like. However, example embodiments are not limited thereto. The environmental sensor 150 may further include various sensors that collect environmental information, such as radiation sensors, dust sensors, and electrical stress sensors.

Figure 18:
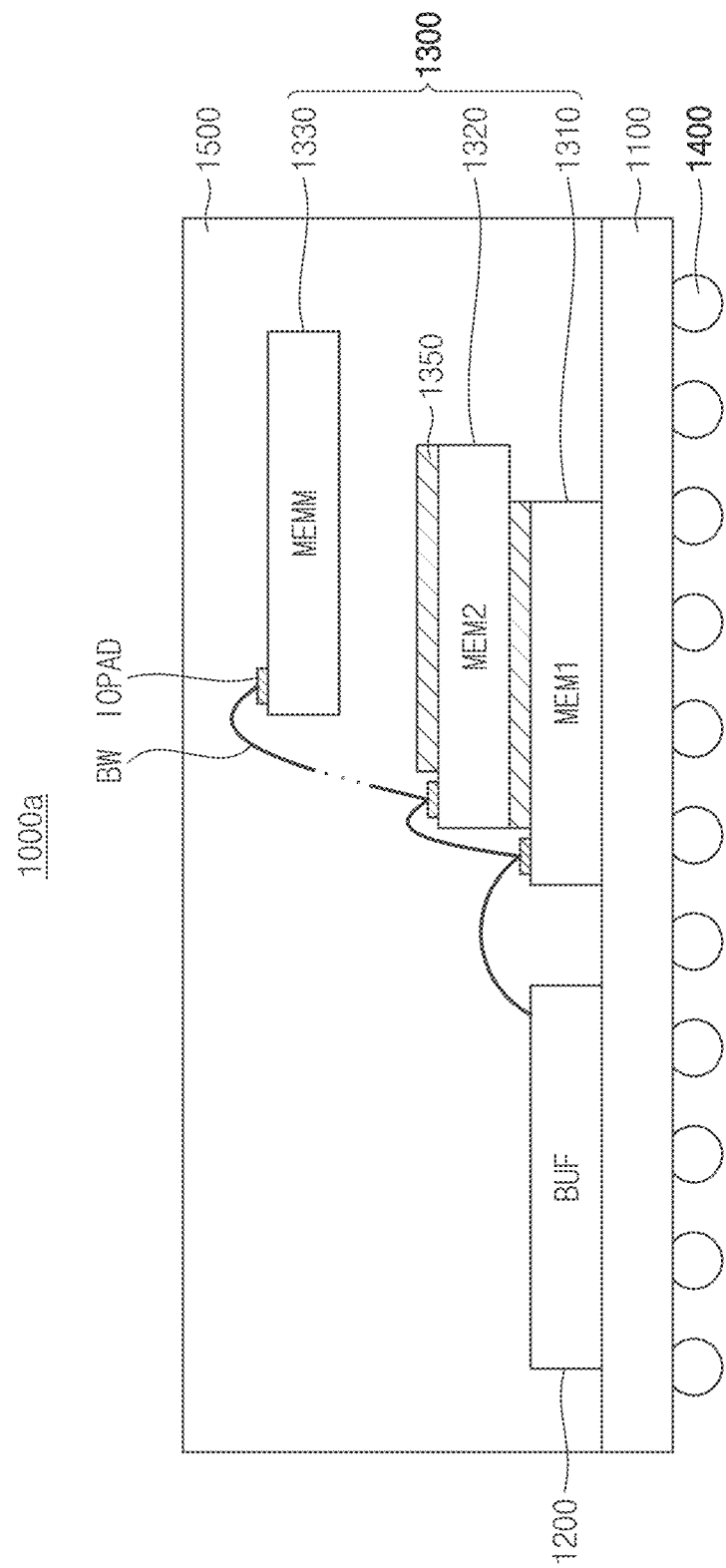
FIGS. 18 and 19 are cross-sectional views of a memory package according to some example embodiments.
Figure 19:
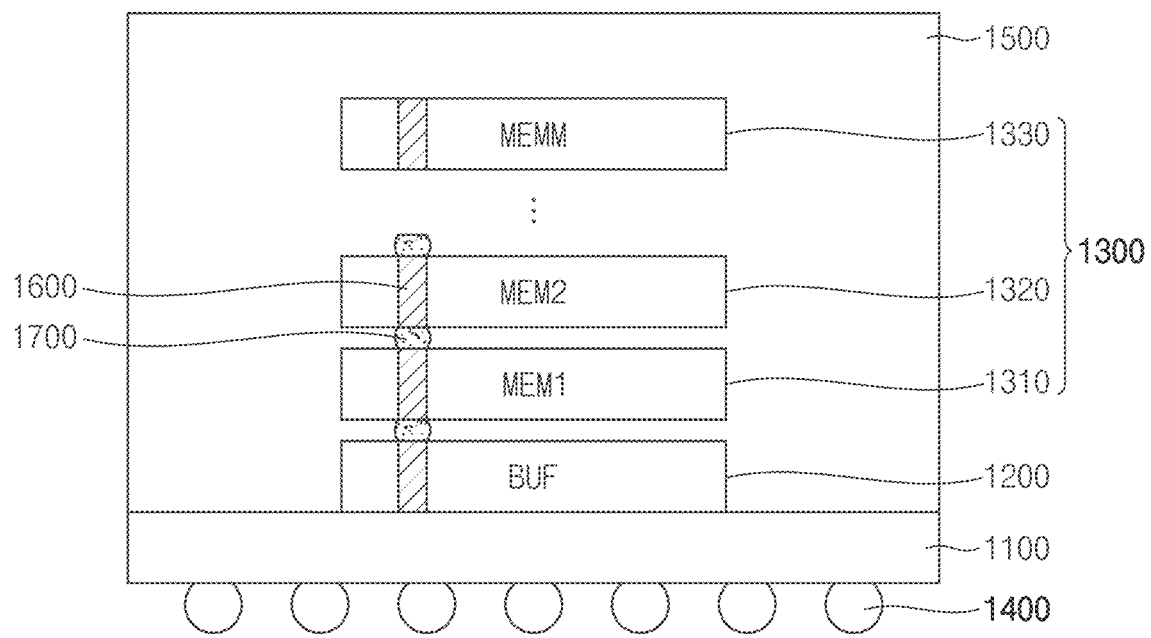

FIGS. 18 and 19 are cross-sectional views of a memory package according to some example embodiments.

Referring to FIG. 18, a memory package 1000a may include a base substrate 1100, a buffer device 1200 formed on the base substrate 1100 and a plurality of memory devices 1300. The buffer device 1200 and the plurality of memory devices 1300 may be spaced apart from each other on the base substrate 1100. The buffer device 1200 may correspond to the buffer device 130 of FIG. 1.

The plurality of memory devices 1300 may include first to Mth memory devices 1310, 1320 and 1330 which are sequentially stacked in the vertical direction on the base substrate 1100, and each of the first to Mth memory devices 1310, 1320, and 1330 may 1330 may include input/output pads IOPAD. For example, the input/output pads IOPAD may include data input/output pads, command pads, and address pads. The first to Mth memory devices 1310, 1320, and 1330 may correspond to the memory device 140 of FIG. 1.

In some example embodiments, the first to Mth memory devices 1310, 1320, and 1330 may be stacked with surfaces on which the input/output pads IOPAD are formed facing upward. In some example embodiments, the input/output pads IOPAD may be arranged adjacent to one edge of each of the first to Mth memory devices 1310, 1320, and 1330. The first to Mth memory devices 1310, 1320, and 1330 may be stacked in a staircase shape, as shown in FIG. 18, so that the input/output pads IOPAD are exposed. In the staircase shaped stacked state, the first to Mth memory devices 1310, 1320, and 1330 may be electrically connected to each other through the input/output pads IOPAD and bonding wires BW, and the first memory device 1310 may be electrically connected to the buffer device 1200 through bonding wires BW.

The stacked memory devices 1310, 1320, and 1330 and the bonding wires BW may be fixed with a sealing member 1500, and an adhesive member 1350 may be provided between the memory devices 1310, 1320, and 1330. Conductive bumps 1400 for electrical connection to an external device may be formed on the lower surface of the base substrate 1100.

Referring to FIG. 19, a memory package 1000b may include a base substrate 1100, a buffer device 1200 formed on the base substrate 1100 and a plurality of memory devices 1300. The buffer device 1200 and the plurality of memory devices 1300 may be sequentially stacked in the vertical direction on the base substrate 1100. Descriptions repeated with those of FIG. 18 will be omitted.

The plurality of memory devices 1300 may include the first to Mth memory devices 1310, 1320 and 1330 sequentially stacked in the vertical direction on the base substrate 1100, and the buffer device 1200. The first to Mth memory devices 1310, 1320 and 1330 may each include through silicon vias (TSVs) 1600. Each of the TSVs 1600 may be formed by penetrating a portion or all of one of the buffer device 1200 and the first to Mth memory devices 1310, 1320 and 1330. For example, the TSVs 1600 may include data input/output TSVs, command TSVs, and address TSVs.

In some example embodiments, the TSVs 1600 may be formed at the same positions within the buffer device 1200 and the first to Mth memory devices 1310, 1320 and 1330. The buffer device 1200 and the first to Mth memory devices 1310, 1320 and 1330 may be stacked so that the TSVs 1600 are completely overlapped, as shown in FIG. 19. In the completely overlapped stacked state, the buffer device 1200 and the first to Mth memory devices 1310, 1320 and 1330 may be electrically connected to each other through the TSVs 1600 and conductive material 1700 and may also be electrically connected to the base substrate 1100.

Figure 20:
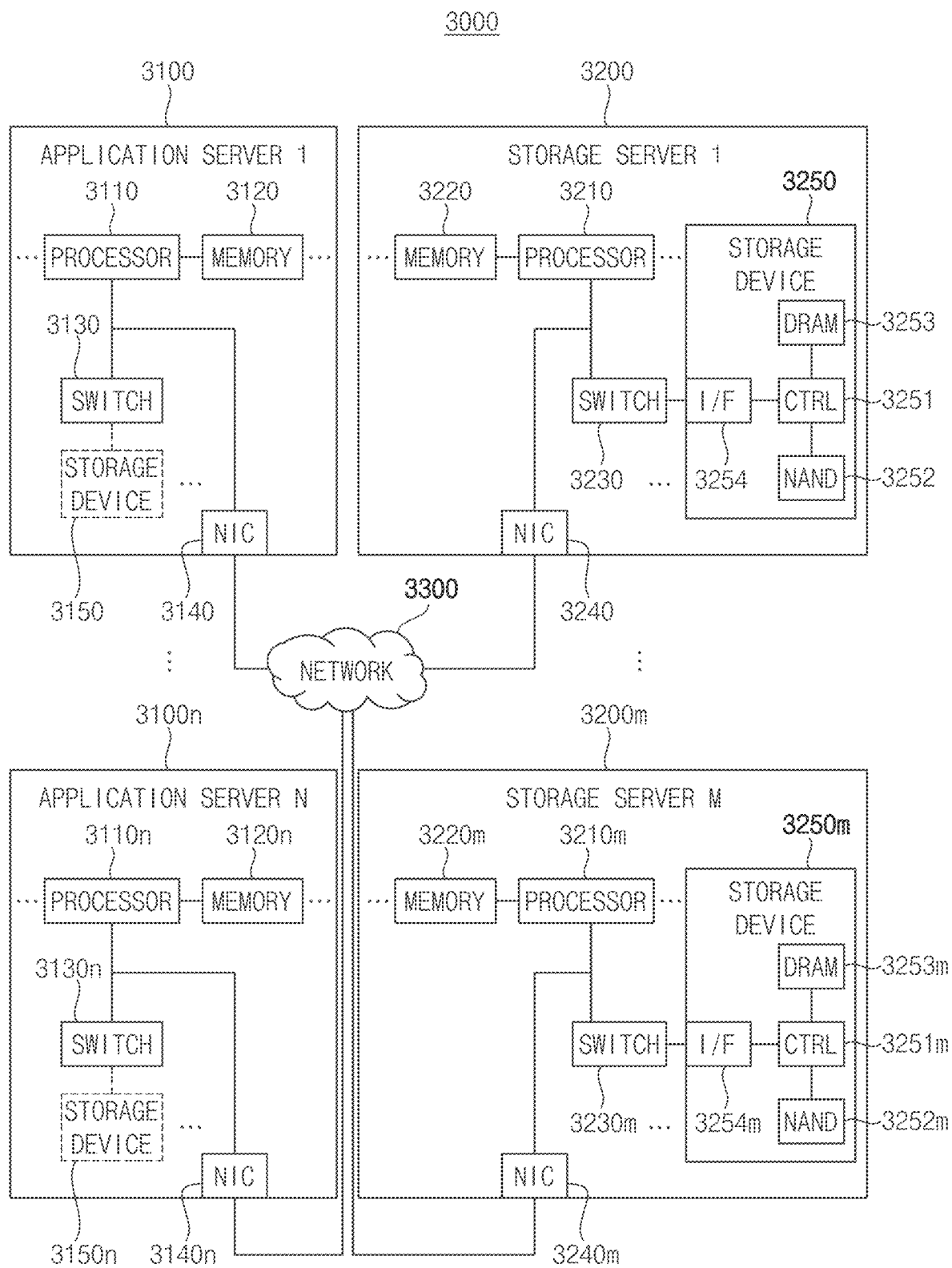
FIG. 20 is a block diagram illustrating a data center including a memory system according to some example embodiments.

FIG. 20 is a block diagram illustrating a data center including a memory system according to some example embodiments.

Referring to FIG. 20, a data center 3000 may be a facility that collects various data and provides services, and may be referred to as a data storage center. The data center 3000 may be a system for search engines and database operations, and may be a computing system used in government agencies or businesses like banks. The data center 3000 may include application servers 3100 to 3100n and storage servers 3200 to 3200m. The number of application servers 3100 to 3100n and storage servers 3200 to 3200m may vary according to some example embodiments, and may differ from each other.

The application server 3100 or storage server 3200 may include at least one processor 3110 and 3210 and memory 3120 and 3220. To describe a storage server 3200 as an example, the processor 3210 may control an overall operation of the storage server 3200, may access to the memory 3220, and may execute instructions and/or data loaded in memory 3220. The memory 3220 may be Double Data Rate Synchronous DRAM (DDR SDRAM), High Bandwidth Memory (HBM), Hybrid Memory Cube (HMC), Dual Inline Memory Module (DIMM), Optane DIMM, or Non-Volatile DIMM (NVMDIMM). In some example embodiments, the number of the processors 3210 and the memories 3220 included in the storage server 3200 may vary. In some example embodiments, the processor 3210 and the memory 3220 may provide a processor-memory pair. In some example embodiments, the number of the processors 3210 and the memories 3220 may differ from each other. The processor 3210 may include a single-core processor or a multi-core processor. The above description of the storage server 3200 may also similarly apply to the application server 3100. In some embodiments, the application server 3100 may not include a storage device 3150. The storage server 3200 may include at least one storage device 3250.

The application servers 3100 to 3100n and the storage servers 3200 to 3200m are configured to communicate with each other through a network 3300. The network 3300 may 3300 may be implemented using Fiber Channel (FC) or Ethernet. FC is a medium used for relatively high-speed data transmission and may use optical switches that provide high performance/high availability. Depending on the access method of the network 3300, the storage servers 3200 to 3200*m* may be provided as file storage, block storage, or object storage.

In some example embodiments, the network 3300 may be a storage-dedicated network such as Storage Area Network (SAN). For example, SAN may be an FC-SAN implemented according to the FCP (FC Protocol) using an FC network. For example, SAN may be an IP-SAN implemented according to the iSCSI (SCSI over TCP/IP or Internet SCSI) protocol using a TCP/IP network. For example, the network 3300 may be a general network such as a TCP/IP network. For example, the network 3300 may be implemented according to protocols such as FC over Ethernet (FCoE), Network Attached Storage (NAS), NVMe over Fabrics (NVMe-oF).

Hereinafter, the application server 3100 and the storage server 3200 will be mainly described. The description of application server 3100 may also apply to other application servers 3100*n*, and the description of storage server 3200 may also apply to other storage servers 3200*m*.

The application server 3100 is configured to store data requested by a user and/or client to be stored in one of the storage servers 3200 to 3200*m* through the network 3300. The application server 3100 may obtain data requested by a user or client to be read from one of the storage servers 3200 to 3200*m* through the network 3300. For example, the application server 3100 may be implemented as a web server or a Database Management System (DBMS).

The application server 3100 may access to the memory 3120*n* or the storage device 3150*n* included in another application server 3100*n* through the network 3300, or access to the memory 3220 to 3220*m* or the storage device 3250 to 3250*m* included in the storage servers 3200 to 3200*m* through the network 3300. Consequently, the application server 3100 may perform various operations on data stored in the application servers 3100 to 3100*n* and/or the storage servers 3200 to 3200*m*. For example, the application server 3100 may 3100 may execute a command to move or copy data between the application servers 3100 to 3100*n* and/or the storage servers 3200 to 3200*m*. The data may be moved from the storage devices 3250 to 3250*m* of the storage servers 3200 to 3200*m*, passing through the memories 3220 to 3220*m* of the storage servers 3200 to 3200*m*, or directly to the memories 3120 to 3120*n* of the application servers 3100 to 3100*n*. Data moving through the network 3300 may be encrypted for security or privacy purposes.

To describe the storage server 3200 as an example, an interface 3254 may provide a physical connection between a processor 3210 and a controller 3251, and a physical connection between a network interface connector (NIC) 3240 and the controller 3251. For example, the interface 3254 may be implemented in a Direct Attached Storage (DAS) method that connects storage device 3250 directly with a dedicated cable. For example, the interface 3254 may be implemented using various interface methods, such as Advanced Technology Attachment (ATA), Serial ATA SATA, external SATA (e-SATA), Small Computer Small Interface (SCSI), Serial Attached SCSI (SAS), Peripheral Component Interconnection (PCI), PCI express (PCIe), NVM express (NVMe), Compute eXpress Link (CXL), IEEE 1394, universal serial bus (USB), secure digital (SD) card, multi media card (MMC), embedded multi-media card (eMMC), UFS, embedded UFS (eUFS), or compact flash (CF) card interfaces, and the like.

The storage server 3200 may further include a switch 3230 and the NIC 3240. The switch 3230 may selectively connect the processor 3210 and the storage device 3250 under the control of the processor 3210, or selectively connect the NIC 3240 and the storage device 3250. Similarly, the application server 3100 may further include a switch 3130 and a NIC 3140.

In some example embodiments, the NIC 3240 may include a network interface card, a network adapter, and the like. The NIC 3240 may be connected to network 3300 through a wired interface, a wireless interface, a bluetooth interface, an optical interface, or the like. The NIC 3240 may include internal memory, DSP, host bus interface, and may be connected to the processor 3210 and/or the switch 3230 or the like, through the host bus interface. The host bus interface may also be implemented as one of the examples of the interface 3254 described above. In some example embodiments, the NIC 3240 may be integrated with at least one of the processor 3210, the switch 3230, and the storage device 3250.

In the storage server 3200 to 3200*m* or the application server 3100 to 3100*n*, a processor is configured to transmit a command to the storage device 3150 to 3150*n* and 3250 to 3250*m* or the memory 3120 to 3120*n* and 3220 to 3220*m* to program or read data. The data may be error-corrected data through an Error Correction Code (ECC) engine. The data may be processed with Data Bus Inversion (DBI) or Data Masking (DM) and may include Cyclic Redundancy Code (CRC) information. The data may be encrypted for security or privacy purposes.

In response to a read command received from the processor, the storage device 3150 to 3150*m* and 3250 to 3250*m* are configured to transmit control signals and command/address signals to the NAND flash memory device 3252 to 3252*m*. When reading data from the NAND flash memory device 3252 to 3252*m*, the Read Enable (RE) signal may be input as a data output control signal and may serve to output data to the DQ bus. The Data Strobe Signal DQS may be generated using the RE signal. Command and address signals may be latched in the page buffer according to the rising or falling edge of a Write Enable (WE) signal.

The controller 3251 is configured to control an overall operation of the storage device 3250. The controller 3251 may write data to the NAND flash 3252 in response to a write command and may read data from the NAND flash 3252 in response to a read command. For example, the write and/or read commands may be provided by a processor 3210 in the storage server 3200, a processor 3210*m* in another storage server 3200*m*, or a processor 3110 and 3110*n* in an application server 3100 and 3100*n*. The DRAM 3253 may 3253 may temporarily store(buffer) data to be written to the NAND flash 3252 or data read from the NAND flash 3252. Furthermore, the DRAM 3253 may store metadata, which is user data or data generated by the controller 3251 to manage the NAND flash 3252.

The storage device 3250 to 3250*m* may be a memory system according to some example embodiments and may perform training operations according to some example embodiments. In some embodiments, the memories 3120 to 3120*n* and 3220 to 3220*m* may also be implemented in the form of memory packages according to some example embodiments.

Example embodiments may be applied to various electronic device or system including memory devices, memory packages, and memory systems. For example, example embodiments may be applied more efficiently to electronic systems such as personal computers, server computers, cloud computers, data centers, workstations, laptops, cellular phones, smart phones, MP3 players, personal digital assistants (PDAs), portable multimedia players (PMPs), digital TVs, digital cameras, portable game consoles, navigation devices, wearable devices, Internet of Things (IoT) devices, Internet of Everything (IoE) devices, e-books, virtual reality (VR) devices, augmented reality (AR) devices, drones, automotive systems, or the like.

As described above, by setting delays and/or address that are different from each other, there may be an effect of improving the performance of the memory devices by performing a one-shot type training method, thereby reducing the number of times training operations are performed for the plurality of memory devices, and thereby increasing the availability of data stored (and/or to be stored) in the memory devices and the reliability of said memory devices.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A memory package comprising:
a buffer device;
a data input/output pin connected to the buffer device and configured to receive a data signal;
a data strobe pin connected to the buffer device and configured to receive a data strobe signal; and
a plurality of memory devices connected to the buffer device and configured to operate based on the data signal and the data strobe signal,
wherein, in response to receiving the data strobe signal and training data in the data signal, the buffer device is configured to perform a training operation on the plurality of memory devices based on the training data and the data strobe signal, and
wherein, during the training operation, the buffer device is configured to set different delays on a plurality of sub-training data included in the training data, and the plurality of sub-training data are stored in different memory regions of the plurality of memory devices.

2. The memory package of claim 1, wherein the buffer device includes processing circuitry configured to
sample the training data based on the data signal and the data strobe signal;
generate a first control signal, for identifying the plurality of sub-training data included in the training data, based on the data strobe signal;
assign a plurality of addresses and a plurality of delays on the plurality of sub-training data based on the first control signal;
generate a second control signal including a delay code associated with the plurality of delays, the plurality of addresses being different from each other, the plurality of delays being different from each other;
set the plurality of delays on the plurality of sub-training data based on the sampled training data and the second control signal; and
output the plurality of sub-training data on which the plurality of delays are set.

3. The memory package of claim 2, wherein
the plurality of sub-training data include first to Nth sub-training data, where N is a natural number greater than or equal to two,
the plurality of addresses include first to Nth addresses, and
the plurality of delays include first to Nth delays.

4. The memory package of claim 3, wherein
the first address and the first delay are set on the first sub-training data,
a second address and a second delay are set on a second sub-training data, and
the Nth address and the Nth delay are set on the Nth sub-training data.

5. The memory package of claim 4, wherein
the second delay is greater than the first delay, and
the Nth delay is greater than the second delay.

6. The memory package of claim 4, wherein the plurality of memory devices include first to Mth memory devices, where M is a natural number greater than or equal to two.

7. The memory package of claim 6, wherein:
the first sub-training data, on which the first delay is set, is stored in first memory regions included in the first to Mth memory devices, the first memory regions correspond to the first address,
the second sub-training data, on which the second delay is set, is stored in second memory regions included in the first to Mth memory devices, the second memory regions correspond to the second address, and
the Nth sub-training data, on which the Nth delay is set, is stored in Nth memory regions included in the first to Mth memory devices, the Nth memory regions correspond to the Nth address.

8. The memory package of claim 7, wherein an operation of storing the first sub-training data is simultaneously performed on the first to Mth memory devices.

9. The memory package of claim 7, wherein an operation of storing the first sub-training data is sequentially performed on the first to Mth memory devices.

10. The memory package of claim 4, wherein the processing circuitry includes an address-delay map configured to represent a relationship between the first to Nth addresses and the first to Nth delays.

11. The memory package of claim 2, wherein the processing circuitry is further configured to generate the first control signal by counting a number of toggles of the data strobe signal.

12. The memory package of claim 2, wherein
the training data is sampled in a double data rate (DDR) scheme, and
the buffer device further includes a multiplexer configured to select one of an output of the sampling of the training data based on the data strobe signal.

13. The memory package of claim 2, wherein the buffer device further includes:
a first receiver connected to the data input/output pin and configured to receive the data signal;
a second receiver connected to the data strobe pin and configured to receive the data strobe signal;
a first transmitter connected to the processing circuitry and configured to output the plurality of sub-training data on which the plurality of delays are set; and
a second transmitter connected to the second receiver and configured to output the data strobe signal.

14. The memory package of claim 2, wherein the buffer device is configured to receive a plurality of read training data, corresponding to the training data from the plurality of memory devices, and to output the plurality of read training data.

15. The memory package of claim 14, wherein
training values associated with the plurality of memory devices are obtained based on a plurality of pass/fail maps, and
the plurality of pass/fail maps are associated with the plurality of memory devices and are obtained based on the training data, the plurality of read training data, and an address-delay map which represents a relationship between the plurality of addresses and the plurality of delays.

16. The memory package of claim 1, wherein
the plurality of memory devices are stacked in a vertical direction on a substrate, and
the buffer device is spaced apart from the plurality of memory devices on the substrate.

17. The memory package of claim 1, wherein the plurality of memory devices and the buffer device are stacked in a vertical direction on a substrate.

18. A memory system comprising:
a memory package; and
a memory controller configured to control the memory package,
wherein the memory package includes
a buffer device,
a data input/output pin connected to the buffer device and configured to receive a data signal,
a data strobe pin connected to the buffer device and configured to receive a data strobe signal, and
a plurality of memory devices connected to the buffer device and configured to operate based on the data signal and the data strobe signal,
wherein, in response to receiving the data signal and training data in the data signal, the buffer device is configured to perform a training operation on the plurality of memory devices based on the training data and the data strobe signal, and
wherein, during the training operation, the buffer device is configured to set different delays on a plurality of sub-training data included in the training data, and the plurality of sub-training are stored in different memory regions of the plurality of memory devices.

19. The memory system of claim 18, wherein the training operation is performed in response to at least one of the memory controller and the memory package being connected at an initial operation time or in response to a change in an operating environment of the memory system being detected.

20. A memory package comprising:
a buffer device;
a data input/output pin connected to the buffer device and configured to receive a data signal;
a data strobe pin connected to the buffer device and configured to receive a data strobe signal; and
a plurality of memory devices connected to the buffer device and configured to operate based on the data signal and the data strobe signal,
wherein, in response to receiving the data strobe signal and training data in the data signal, the buffer device is configured to perform a training operation on the plurality of memory devices based on the training data and the data strobe signal,
wherein, during the training operation, the buffer device is configured to set different delays on a plurality of sub-training data included in the training data, and the plurality of sub-training data are stored in different memory regions of the plurality of memory devices,
wherein the plurality of sub-training data include first to Nth sub-training data,
wherein, during the training operation, the buffer device is configured to set a first address, of a plurality of addresses, and a first delay, of a plurality of delays, on the first sub-training data, and the first sub-training data on which the first delay is set is stored in first memory regions included in the plurality of memory devices corresponding to the first address simultaneously or sequentially, and to receive a plurality of read training data included in the training data from the plurality of memory devices and output the plurality of read training data, and
wherein, during the training operation, a plurality of pass/fail maps, associated with the plurality of memory devices, are obtained based on the training data and the plurality of read training data, and training values associated with the plurality of memory devices are obtained based on the plurality of pass/fail maps.

* * * * *